(12) United States Patent
Enya et al.

(10) Patent No.: US 8,048,702 B2
(45) Date of Patent: Nov. 1, 2011

(54) METHOD OF FABRICATING NITRIDE-BASED SEMICONDUCTOR OPTICAL DEVICE

(75) Inventors: Yohei Enya, Itami (JP); Yusuke Yoshizumi, Itami (JP); Masaki Ueno, Itami (JP); Takashi Kyono, Itami (JP); Katsushi Akita, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 94 days.

(21) Appl. No.: 12/692,154

(22) Filed: Jan. 22, 2010

(65) Prior Publication Data

US 2010/0190284 A1 Jul. 29, 2010

(30) Foreign Application Priority Data

Jan. 23, 2009 (JP) .................................. 2009-013327

(51) Int. Cl.
*H01L 21/00* (2006.01)
(52) U.S. Cl. .......... 438/47; 438/22; 438/46; 257/E21.09
(58) Field of Classification Search .................... 438/22, 438/46, 47; 257/13, 14, 103, E21.09
See application file for complete search history.

(56) References Cited

U.S. PATENT DOCUMENTS

| 6,887,727 B2* | 5/2005 | Takeuchi et al. ................. 438/22 |
| 2003/0059971 A1 | 3/2003 | Chua et al. |
| 2010/0213439 A1* | 8/2010 | Ueno et al. ........................ 257/13 |

FOREIGN PATENT DOCUMENTS

WO WO-2006/109840 A1 10/2006

OTHER PUBLICATIONS

Liu et al., "Effects of TMIn flow on the interface and optical properties of InGaN/GaN multiple quantum wells," Journal of Crystal Growth, 264, pp. 53-57 (2004).
Senthil Kumar et al., "Improved internal quantum efficiency of green emitting InGaN/GaN multiple quantum wells by in preflow for InGaN well growth," Japanese Journal of Applied Physics, vol. 47, No. 2, pp. 839-842 (2008).
Lin et al., "Enhancing the quantum efficiency of InGaN green light-emitting diodes by trimethylindium treatment," Applied Physics Letters, 92, pp. 16113-1-16113-3 (2008).

* cited by examiner

*Primary Examiner* — Charles Garber
*Assistant Examiner* — Abdulfattah Mustapha
(74) *Attorney, Agent, or Firm* — Venable LLP; Michael A. Sartori

(57) ABSTRACT

In the method of fabricating a nitride-based semiconductor optical device by metal-organic chemical vapor deposition, a barrier layer is grown at a first temperature while supplying a gallium source to a reactor. The barrier layer comprises a first gallium nitride-based semiconductor. After the growth of the barrier layer, a nitrogen material and an indium material are supplied to the reactor without supply of the gallium source to perform a preflow of indium. Immediately after the preflow, a well layer is grown on the barrier layer at a second temperature while supplying an indium source and the gallium source to the reactor. The well layer comprises InGaN, and the second temperature is lower than the first temperature. The gallium source and the indium source are supplied to the reactor during plural first periods of the step of growing the well layer to grow plural InGaN layers, respectively. The indium material is supplied to the reactor without supply of the gallium source during the second period of the step of growing the well layer. The second period is between the first periods. The well layer comprises the plural InGaN layers.

19 Claims, 14 Drawing Sheets

Fig.1
(a)
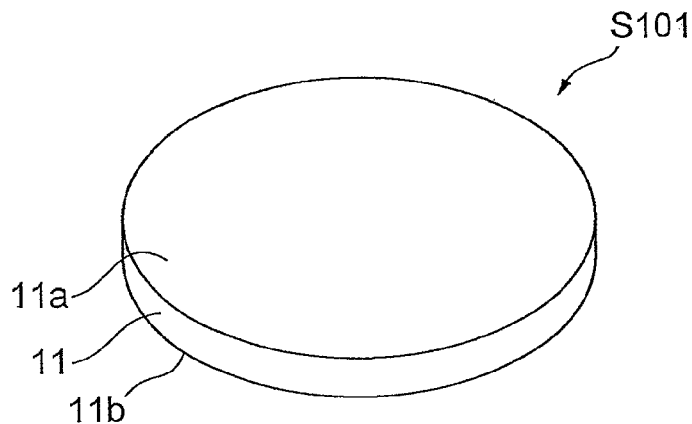
(b)
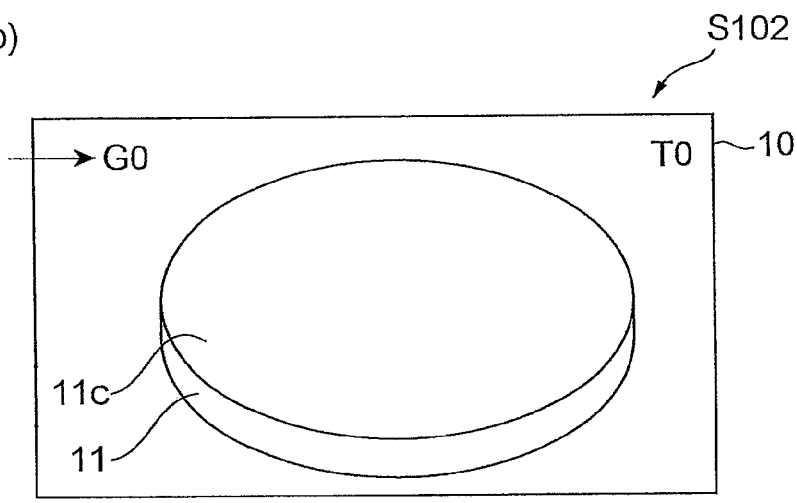
(c)
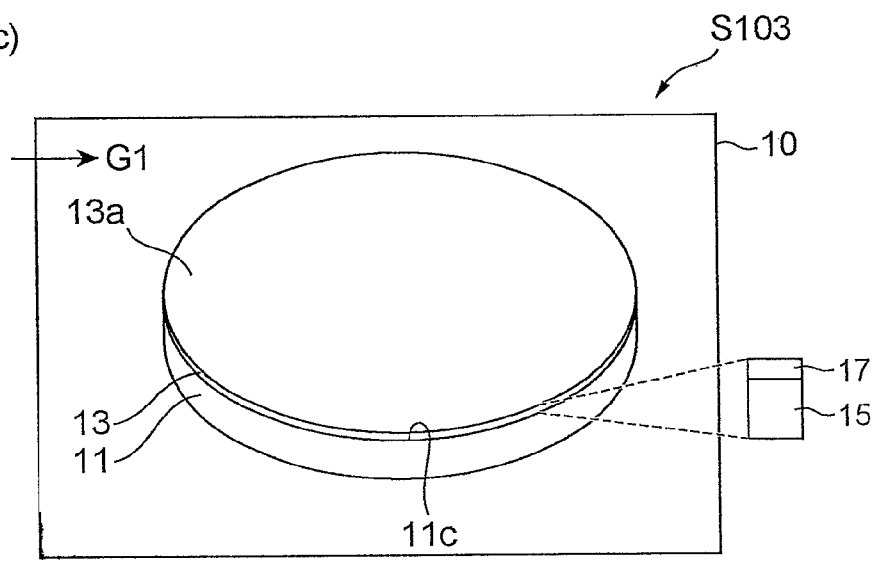

Fig.3
(a)
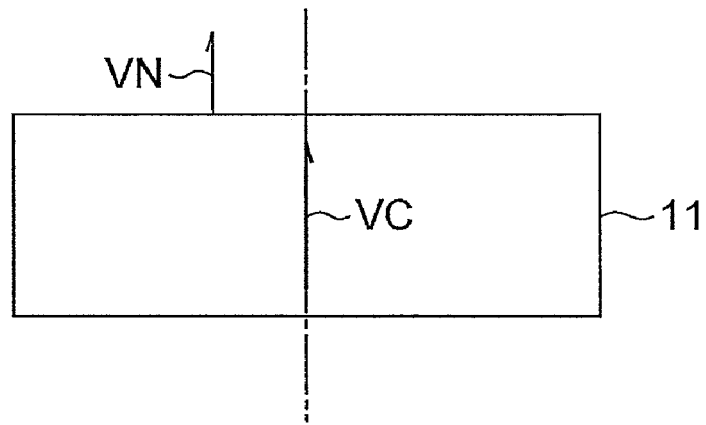
(b)
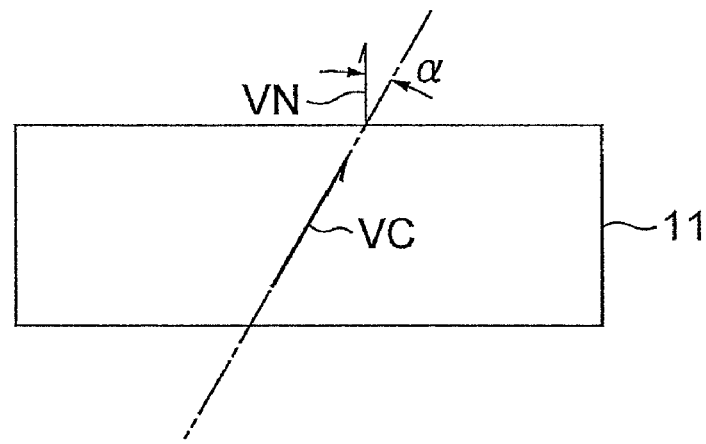
(c)
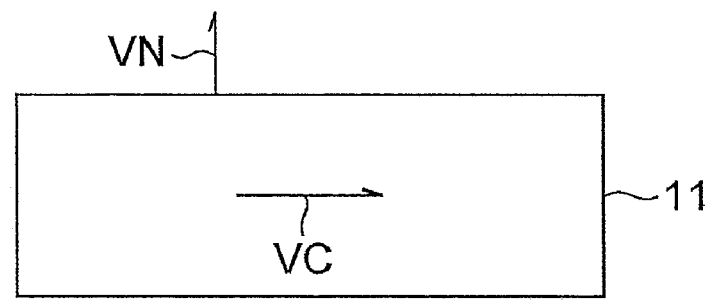

*Fig.12*
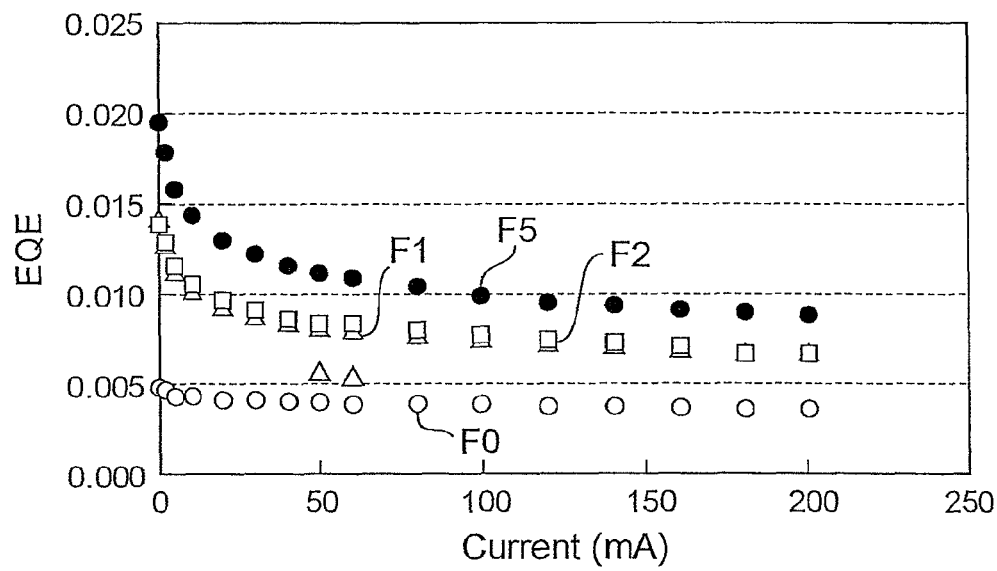
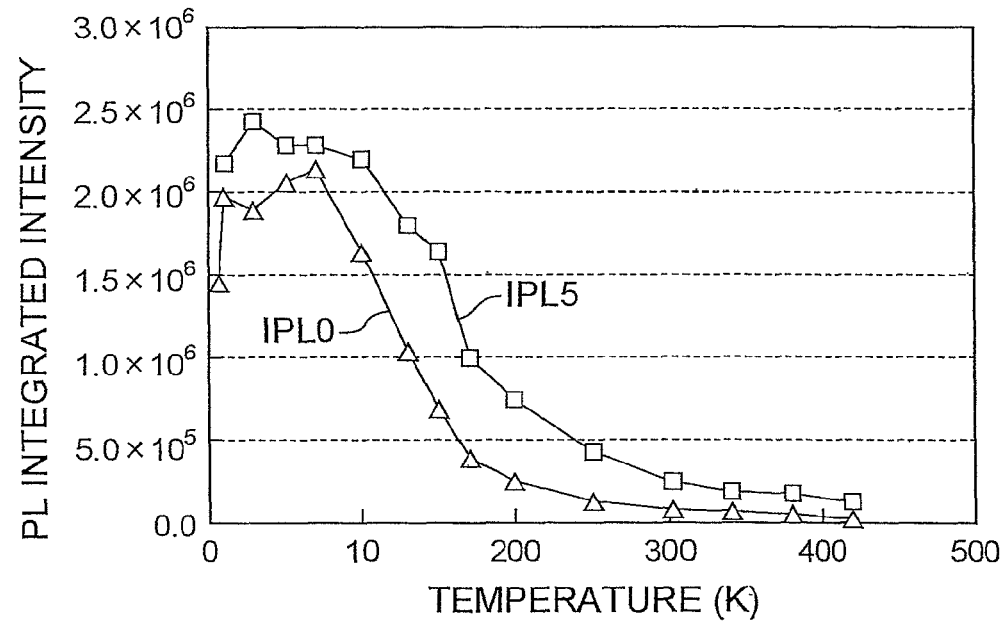

Fig. 14
(a)
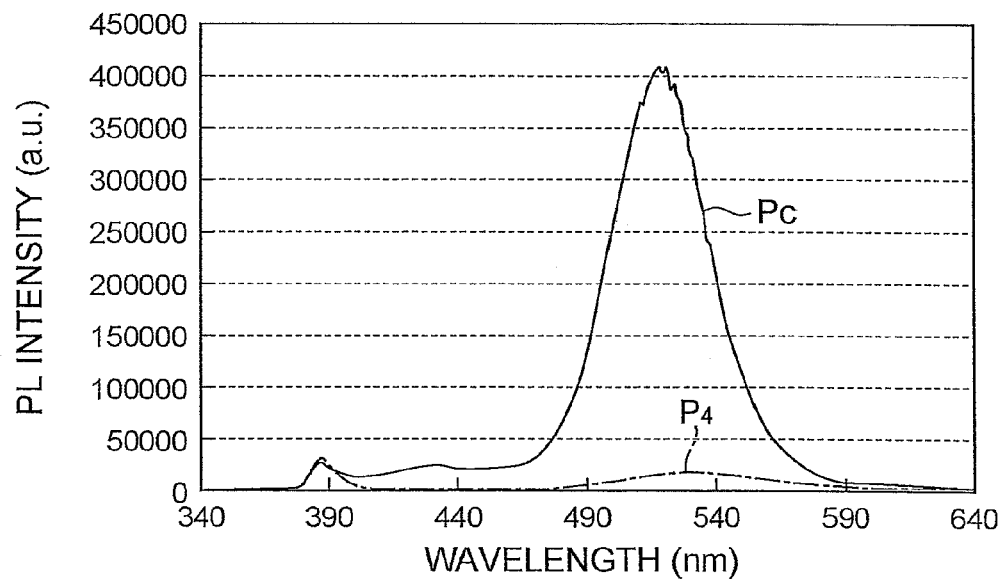
(b)
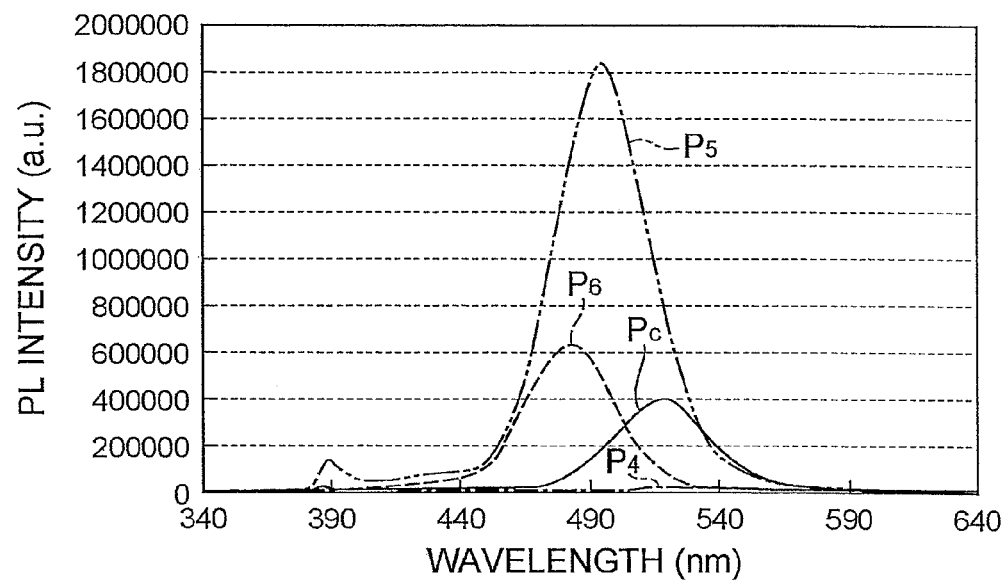

METHOD OF FABRICATING NITRIDE-BASED SEMICONDUCTOR OPTICAL DEVICE

TECHNICAL FIELD

The present invention relates to a method of fabricating a nitride-based semiconductor optical device.

BACKGROUND ART

Nonpatent Literature 1 (Journal of Crystal Growth, 264 (2004), pp. 53-57) discloses a quantum well structure grown on a c-plane sapphire substrate. The supplying of TMIn is performed to before growing an InGaN layer.

Nonpatent Literature 2 (Japanese Journal of Applied Physics, Vol. 47, No. 2 (2008) pp. 829-842) discloses an InGaN/GaN multiple quantum well structure grown on a c-plane sapphire substrate. In the formation of the multiple quantum well structure, after growing a GaN barrier layer at a first growth temperature, the substrate temperature is lowered to a second growth temperature for the well layer. After the substrate temperature has been lowered, indium is supplied onto the GaN barrier layer at the second growth temperature, and then an InGaN well layer is grown thereon. Just after having growing the InGaN well layer, a GaN cap layer is grown on this well layer. The growth of the GaN cap layer is performed while the temperature is raised from the second growth temperature to the first growth temperature. After growing the GaN cap layer, the growth is interrupted at the first growth temperature. Then, another GaN barrier layer is grown on the GaN cap layer. The supply of indium does not affect the indium content and abruptness at the surface boundary in the InGaN/GaN structure. This process, i.e., the supply of InGaN, ensures a decrease in density of V-shaped defects in the InGaN/GaN quantum structure.

Nonpatent Literature 3 (Applied Physics Letters, Vol. 92 (2008) 161113) discloses an InGaN/GaN quantum well structure grown on a c-plane sapphire substrate. A quantum well layer and a barrier layer are grown at a temperature of 780° C. In the growth of the quantum well structure, TMIn and ammonia are supplied to a reactor after the growth of the InGaN well layer and before the growth of the GaN barrier layer. This step reduced the density of V-shaped defects from $3.9 \times 10^8$ to $2.9 \times 10^8$ cm$^{-2}$ in a single quantum well structure, and from $7.8 \times 10^8$ to $4.7 \times 10^8$ cm$^{-2}$ in a multiple quantum well structure.

SUMMARY OF INVENTION

According to the knowledge of the inventors, a preflow of indium raw material (for example, trimethylindium) immediately before the growth of a well layer in a quantum well structure for a light-emitting device improves incorporation of indium into the well layer at an initial stage of its growth. Such an improvement in the incorporation of indium causes the emission wavelength of the light-emitting device to shift toward longer wavelengths. In addition, this improvement leads to an increased average density of indium per unit volume in the InGaN well layer, and increases local regions of higher-indium content in the InGaN well layer.

The present invention has been accomplished in view of such circumstances, and it is an object of the present invention to provide a method of fabricating a nitride-based semiconductor optical device, which can improve the homogeneity of the indium content variation across the thickness of a well layer and can reduce the density of defects in the well layer.

One aspect of the present invention provides a method of fabricating a nitride-based semiconductor optical device including an active layer by metal-organic chemical vapor deposition. The method comprises the steps of (a) growing a barrier layer at a first temperature while supplying a first source gas to a reactor, the first raw material gas including a gallium source as Group III raw material, and the barrier layer comprising a first gallium nitride-based semiconductor; (b) after the growth of the barrier layer, supplying a nitrogen material and an indium material to the reactor without supply of the gallium source to perform a preflow of indium; and (c) immediately after the preflow, growing a well layer on the barrier layer at a second temperature while supplying a second raw material gas to the reactor, the second raw material gas including an indium source and the gallium source as Group III raw material, the well layer comprising InGaN, and the second temperature being lower than the first temperature. The gallium source and the indium source are supplied as Group III raw material to the reactor during plural first periods of the step of growing the well layer to grow plural InGaN layers, respectively. The indium material is supplied to the reactor without supply of the gallium source during the second periods of the step of growing the well layer. The second periods are between the first periods. The well layer comprising the plural InGaN layers, and the active layer comprises the well layer and the barrier layer, and is provided on the primary surface of a gallium nitride-based semiconductor region.

The method, which involves the preflow of indium (In) before the growth of the InGaN well layer, improves the homogeneity of the indium composition across the thickness of the well layer. Immediately after the preflow, the InGaN well layer is grown without interruption of supplying the indium source and the nitrogen source. Since the InGaN layers are grown two or more times and indium intermediate flows are performed without interruption between these growths of the InGaN layers in order to form the InGaN well layer, the density of defects in the InGaN layers can be reduced for each growth of the InGaN layers.

In the method of the present invention, at least part of the preflow period can be performed at the second temperature. This modified preflow step enables an indium-rich underlying layer to be formed at the second temperature at which InGaN can be grown, prior to start of the growth of a well layer.

In the method of the present invention, the indium source may include trimethylindium, and the nitrogen source may include ammonia. The use of such materials used for metal-organic chemical vapor deposition enhances the technical advantages of the preflow.

The method of the present invention may further include the step of performing a postflow of the indium source without supply of the gallium source to the reactor immediately after the growth of the well layer. According to the method, the surface of the InGaN well layer is rearranged through thermal treatment of the surface in an atmosphere containing the indium source, without interruption of supplying the indium source.

In the method of the present invention, at least part of the postflow period may be performed at the second temperature. This modified postflow step at the second temperature can reduce defects on the surface of the grown InGaN well layer, before the growth of a barrier layer.

The method of the present invention may further include the step of growing another barrier layer composed of a second gallium nitride-based semiconductor on the well layer at the first temperature after the postflow. This step, which deposits the other barrier layer on the surface of InGaN modified by the postflow, can reduce defects inherited from the surface of the well layer, which can improve the crystal quality of the other barrier layer.

The method of the present invention may further include the steps of growing a protective layer composed of a gallium nitride-based semiconductor on the well layer and growing another barrier layer composed of the second gallium nitride-based semiconductor on the protective layer at the first temperature. A band gap of the protective layer is less than or equal to that of the barrier layer, and the band gap of the protective layer is greater than that of the well layer.

The method, which involves the growth of the protective layer after the growth of the well layer, can prevent desorption of indium from the surface of the well layer during heating to the first temperature for the growth of the barrier layer.

The method of the present invention may further include the steps of growing a protective layer composed of the gallium nitride-based semiconductor on the well layer after the postflow and growing another barrier layer composed of the second gallium nitride-based semiconductor on the protective layer at the first temperature. A band gap of the protective layer is less than or equal to that of the barrier layer, and the band gap of the protective layer is greater than that of the well layer.

The method, which covers the surface of the InGaN well layer with the protective layer after reconstruction of the surface by the postflow, can improve the crystal quality of the barrier layer.

The method of the present invention can increase the temperature of the substrate for at least part of the growth period of the protective layer. This process can reduce the growth time of the active layer and can improve the crystal quality of the protective layer by growth of the part of the protective layer at a high temperature.

In the method of the present invention, the primary surface of the InGaN well layer is semipolar and tilts from the reference axis extending along the c-axis of InGaN of the well layer. The tilt angle of the primary surface may be in the range of 10 to 80 degrees.

The method can reduce the area of the piezoelectric field in the well layer, can improve the homogeneity of the indium content across the thickness of the well layer, and can reduce the density of defects in the well layer.

In the method of the present invention, the primary surface of the InGaN well layer may tilt by −10 to +10 degrees from a plane orthogonal to the reference axis extending along the c-axis of the InGaN well layer.

In the method of the present invention, the primary surface of the InGaN well layer may substantially tilts by −10 to +10 degrees from the plane orthogonal to the reference axis extending along the a-axis or the m-axis of the InGaN well layer.

The method, which can substantially eliminates the area of the piezoelectric field in the well layer, can improve the homogeneity of the indium content across the thickness of the well layer, and can reduce the density of defects in the well layer.

The method of the present invention may further include the steps of preparing a substrate composed of sapphire and growing the gallium nitride-based semiconductor area on the primary surface of the substrate.

Alternatively, the method of the present invention may further include the steps of preparing a substrate composed of a gallium nitride-based semiconductor or a Group III nitride semiconductor and growing the gallium nitride-based semiconductor area on the primary surface of the substrate. These steps can deposit a gallium nitride-based semiconductor with low defects.

In the method of the present invention, the substrate may be composed of GaN, and can use a GaN substrate with low defects.

Alternatively, in the method of the present invention, the substrate may be composed of AlGaN or AlN. In the method of the present invention, the substrate may be composed of GaN, and the threading dislocation density of the substrate may be $1 \times 10^{+7}$ cm$^{-2}$ or less.

In the method of the present invention, the primary surface of the substrate is semipolar and tilts from the reference axis extending along the c-axis of the gallium nitride-based semiconductor. The tilt angle of the primary surface may be in the range of 10 to 80 degrees. The method can reduce the area of the piezoelectric field in the well layer, can improve the evenness of the indium content across the thickness of the well layer, and can reduce the density of defects in the well layer.

The object described above and other objects, features, and advantages of the present invention will be made more clear from the embodiments of the present invention described with reference to the accompanying drawings.

BRIEF DESCRIPTION OF DRAWINGS

FIG. 1 is a schematic view illustrating primary steps of a method of fabricating a nitride-based semiconductor optical device and an epitaxial wafer according to an embodiment of the present invention.

FIG. 3 is a schematic view illustrating a substrate having a polar primary surface, a substrate having a semipolar primary surface, and a substrate having a nonpolar primary surface.

FIG. 12 shows graphs illustrating the external quantum efficiency and the temperature dependence of the integrated PL intensity of the light-emitting diode.

FIG. 14 shows graphs showing photoluminescence (PL) spectra of Example 4.

DESCRIPTION OF EMBODIMENTS

Figure 2:
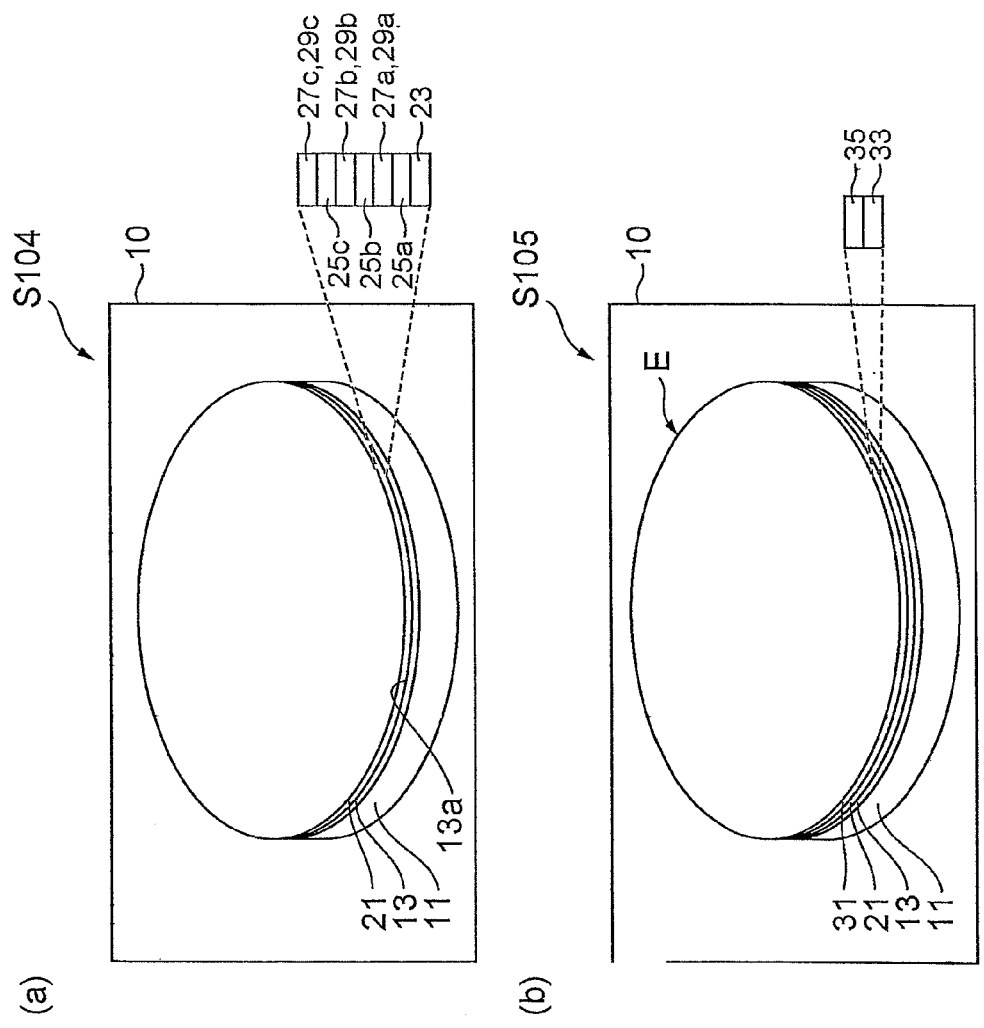
FIG. 2 is a schematic view illustrating primary steps of a method of fabricating the nitride-based semiconductor optical device and the epitaxial wafer according to an embodiment of the present invention.

The teachings of the present invention will be readily understood through the following detailed description with reference to the accompanying drawings shown as examples. Embodiments according to a method of fabricating a nitride-based semiconductor optical device and an epitaxial wafer of the present invention will be described with reference to the accompanying drawings. The same elements are designated by the same reference numerals, if possible.

FIGS. 1 and 2 are schematic views illustrating primary steps in a method of fabricating a quantum well structure, a method of fabricating a nitride-based semiconductor optical device, and a method of fabricating an epitaxial wafer according to an embodiment of the present invention. With reference to Part (a) of FIG. 1, in step S101, a substrate 11 is prepared for use in fabricating a nitride-based semiconductor optical device and an epitaxial wafer. The primary surface of the substrate 11 may have an area of, for example, 25 mm$^2$ or more and a size of, for example, 5 mm square or more. Alternatively, the maximum value of the distance between two points on the edge (for example, the diameter) of the substrate 11 may be, for example, 45 mm or more. Such a substrate is called, for example, a "wafer". The substrate 11 has a primary surface 11a and a rear surface 11b. The rear surface 11b may be substantially parallel with the primary surface 11a. The substrate 11 may be composed of, for example, a hexagonal semiconductor $In_S Al_T Ga_{1-S-T}N$ ($0 \leq S \leq 1$, $0 \leq T \leq 1$, $0 \leq S+T \leq 1$), sapphire, or gallium oxide (for example, monoclinic $Ga_2O_3$). The hexagonal semiconductor $In_S Al_T Ga_{1-S-T}N$ may be composed of, for example, GaN, AlGaN, or AlN. The GaN substrate 11 provides epitaxial growth with high crystal quality.

Parts (a), (b) and (c) of FIG. 3 show a substrate having a polar primary surface, a substrate having a semipolar primary surface, and a substrate having a nonpolar primary surface, respectively. Each figure depicts the c-axis vector VC indicating the direction of the c-axis and the normal vector VN of the primary surface 11a of the hexagonal nitride semiconductor constituting the substrate 11. The vector VC indicates the direction of the c-axis or the orientation of a {0001} surface. The use of GaN provides a GaN substrate with low defects. The threading dislocation density of the GaN substrate may be $1 \times 10^{+7}$ cm$^{-2}$ or less.

With reference to Part (a) of FIG. 3, the c-axis vector VC is substantially oriented in the same direction as that of the normal vector VN, and thus the primary surface 11a of the substrate 11 is polar.

With reference to Part (b) of FIG. 3, the primary surface of the substrate 11 has a tilt angle (an off angle) α, and thus the primary surface 11a of the substrate 11 is semipolar. The primary surface 11a of the substrate 11 tilts by 10 to 80 degrees from the {0001} surface or the {000-1} surface of the hexagonal nitride semiconductor. When the primary surface 11a has a tilt angle that is equal or greater than the absolute value of the lower limit, the magnitude of piezoelectric field is 90 percent or less of that of the c-plane, resulting in a reduction in the magnitude of the piezoelectric field in the well layer. When the primary surface 11a has a tilt angle that is equal or less than the absolute value of the upper limit, a substrate of a size larger than a nonpolar surface substrate can be fabricated from an ingot grown in the direction of the c-axis. The substrate having a primary surface of a polarity which is not polar (i.e., semipolar or nonpolar) can reduce the magnitude of piezoelectric field in the well layer, and, as described below, the relevant substrate can improve the uniformity of the indium content in the layer thickness direction of the well layer and can reduce the density of defects in the well layer.

With reference to Part (c) of FIG. 3, the c-axis vector VC is substantially oriented in the orthogonal direction to the normal vector VN, and thus the primary surface 11a of the substrate 11 is nonpolar.

A semiconductor crystal is epitaxially grown on the primary surface 11a of the substrate 11 by metal-organic chemical vapor deposition. In the subsequent steps, an embodiment in which the substrate 11 is composed of GaN will be described.

The substrate 11 is placed in a reactor 10. With reference to Part (b) if FIG. 1, in step S102, a modified primary surface 11c is formed through thermal treatment of the substrate 11 while a gas G0 is supplied to the reactor 10 before formation of films. The thermal treatment may be performed in an atmospheric gas containing ammonia and hydrogen. The temperature for the thermal treatment T0 may be, for example, 1050° C. (degrees Celsius). The thermal treatment modifies the primary surface 11a of the substrate 11 into a thermally-treated primary surface 11c. The treatment time for this thermal process can be, for example, about 10 minutes. After the thermal treatment, epitaxial films composed of a gallium nitride-based semiconductor are grown on the primary surface 11c of the substrate 11.

With reference to Part (c) of FIG. 1, in step S103, a first conductive-type gallium nitride-based semiconductor region 13 is epitaxially grown on the primary surface 11c of the substrate 11 after the thermal treatment. In order to perform this growth, a raw material gas G1 is supplied to the reactor 10. The first conductive-type gallium nitride-based semiconductor region 13 may include one or more gallium nitride-based semiconductor layers (for example, gallium nitride-based semiconductor layers 15 and 17). For example, the gallium nitride-based semiconductor layers 15 and 17 may be an n-type GaN layer and an n-type InGaN layer, respectively. The gallium nitride-based semiconductor layers 15 and 17 are epitaxially grown on the primary surface 11c of the substrate 11 in sequence. The n-type GaN layer works as, for example, a layer for providing n-type carriers, and the n-type InGaN layer works as, for example, a buffer layer for an active layer. If needed, the first conductive-type gallium nitride-based semiconductor region 13 may include an n-type AlGaN layer that covers the entire surface of the substrate 11.

Figure 4:
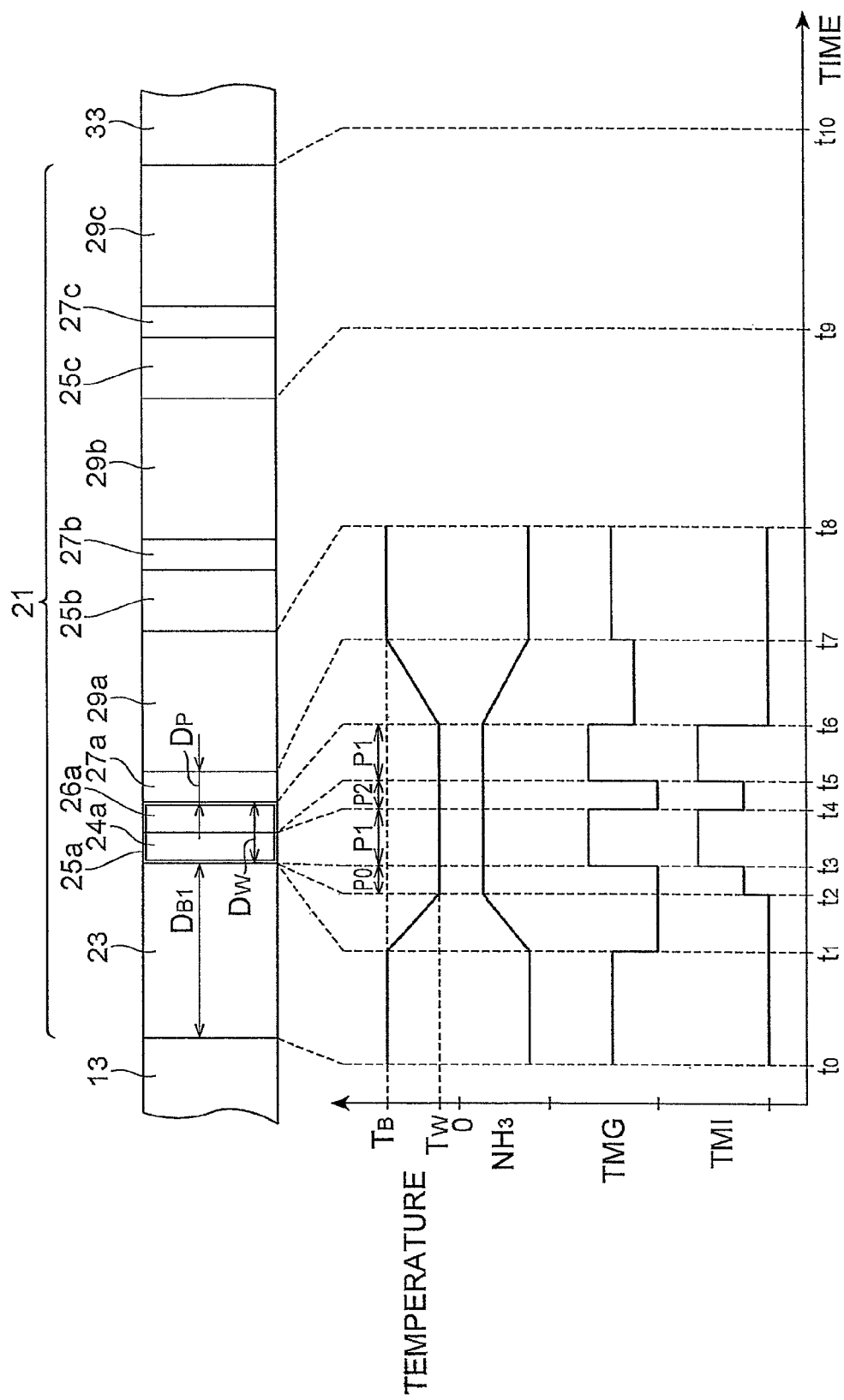
FIG. 4 is a time chart illustrating a profile of supply of source gases and a profile of temperature of a reactor in the formation of an active layer.

With reference to Part (a) of FIG. 2, in step S104, an active layer 21 of the gallium nitride-based semiconductor optical device is formed. The active layer 21 is grown on the buffer layer (the gallium nitride-based semiconductor layer 17). The active layer 21 is provided so as to emit light of an emission spectrum which has a peak wavelength, for example, in the range of 370 to 600 nm. The process for forming the quantum well structure of the active layer 21 is described in detail below with reference to FIG. 4, which is a time chart illustrating a profile of raw material gases and a profile of the temperature of the reactor during the formation of the active layer. A gallium source, an indium source, and a nitrogen source are used as the raw material gases. The gallium source, the indium source, and the nitrogen source supply, for example, TMG, TMI, and NH$_3$, respectively. The active layer 21 includes a well layer and a barrier layer, as described below, and is provide on the primary surface 13a of the gallium nitride-based semiconductor region 13.

At time t0, the substrate is held at a temperature $T_B$. In the period between time t0 and time t1, the gallium source and the nitrogen source are supplied to the reactor 10 to grow a barrier layer 23 composed of a first gallium nitride-based semiconductor. The first gallium nitride-based semiconductor is composed of, for example, $In_Y Ga_{1-Y}N$ (indium content Y: $0 \leq Y$ 0.10, where Y represents a strained composition), and the barrier layer 23 may be composed of, for example, GaN, InGaN, or InAlGaN. The barrier layer 23 is grown at the temperature $T_B$, for example, in the temperature range of 750 to 950° C. In this embodiment, a source gas containing the gallium source and the nitrogen source is supplied to the reactor 10 to grow GaN. The thickness of the GaN barrier layer $D_{B1}$ is, for example, 15 nm. In the period between time t1 and time t2, the temperature of the substrate is changed from $T_B$ to $T_W$.

After the growth of the barrier layer 23, between time t2 and time t3, the preflow of indium source is carried out while the nitrogen source is supplied to the reactor 10 without supply of the gallium source. In the preflow period, no growth occurs. The period P0 for the preflow may be, for example, 10 seconds or more, which completely spreads the indium source over the entire surface of the wafer and foams an indium-rich surface. Alternatively, the preflow period P0 may be, for example, 180 seconds or less. This period is enough to make an indium-rich surface on the wafer and can reduce the use of unwanted raw material gas. At least part of the preflow may be performed at the temperature $T_W$. This preflow step can form an indium-rich base at the temperature $T_W$, prior to the growth of a well layer 25a.

Immediately after the preflow, the gallium source and the nitrogen source are supplied to the reactor 10 without interruption of the supply of the indium source and the nitrogen source to grown the well layer 25a of InGaN on the barrier layer 23 at the temperature $T_W$. The temperature $T_W$ at which the well layer 25a is grown can be within the range of, for example, 650 to 850° C.

The period of the growth of the well layer includes first periods P1 and a second period P2. The second period P2 is between these first periods P1. In the first periods P1, the gallium source and the indium source, which work as Group III sources, are supplied to the reactor 10 to grow InGaN thin layers. In the second period P2, the intermediate flow, which supplies the indium source and the nitrogen source to the reactor 10 without supply of the gallium source, is performed. One of the second period P2 and the first period P1 is followed by the other without intermission. In this embodiment, the first periods P1 reside between time t3 and time t4, and between time t5 and time t6. Between time t3 and time t4, an InGaN thin layer 24a is grown, and between time t5 and time t6, an InGaN thin layer 26a is grown. The second period P2 resides between time t4 and time t5. The well layer 25a in the active layer 21 includes the InGaN thin layers 24a and 26a. The intermediate flow period P2 may be, for example, 10 seconds or more, which completely provides the entire surface of the wafer with the indium source to create an indium-rich surface. Alternatively, the intermediate flow period P2 may be, for example, 180 seconds or less. This value is enough to make the surface of the wafer indium-rich, and can reduce the use of the source gas.

The indium preflow period P0, which is performed before the growth of the InGaN well layer 25a, improves the non-uniformity in the indium content across the thickness of the well layer caused in the initial period immediately after the start of the growth of the well layer 25a. Since two or more InGaN thin layers are grown and indium intermediate flows are performed during its growth in order to form the InGaN well layer, the density of defects in the well layer 25a can be reduced for each growth of the InGaN thin layers 24a and 26a. The indium source for the indium preflow may include, for example, trimethylindium. The nitrogen source may include ammonia. The use of such materials used for metal-organic chemical vapor growth provides the technical advantages of the preflow.

At a time t6, the growth of the well layer 25a is completed. A protective layer 27a is grown after the growth of the well layer 25a. The protective layer 27a is composed of a gallium nitride-based semiconductor, for example, $In_ZGa_{1-Z}N$ (indium content Z: $0 \leq Z \leq 1$, Z represents a strained composition). The gallium nitride-based semiconductor may be composed of, for example, GaN or InGaN. The growth of the protective layer 27a starts immediately after the well layer 25a has been grown. Since the protective layer 27a is subsequently grown immediately after the well layer 25a has been grown, so that desorption of indium from the surface of the well layer 25a can be prevented during temperature rising performed before the growth of the barrier layer. The temperature of the substrate can be increased for at least part of the growth period of the protective layer 27a. In this embodiment, the temperature of the substrate is changed from the temperature $T_W$ to the temperature $T_B$ in the period of time t6 to time t7. The protective layer 27a can be grown for the entire or a part of the changing period of the temperature. The thickness $D_P$ of the protective layer 27a is smaller than the thickness $D_B$ of the barrier layer 23. The thickness $D_P$ of the protective layer 27a may be, for example, 1.0 nm, or in the range of 0.3 to 3.0 nm.

After the growth of the protective layer 27a, a barrier layer 29a is grown on the protective layer 27a at the temperature $T_B$ in the period of time t7 to time t8. The barrier layer 29a is composed of a second gallium nitride-based semiconductor. The barrier layer 29a is composed of a gallium nitride-based semiconductor, for example, $In_YGa_{1-Y}N$ (indium content Y: $0 \leq Y < 1$, Y represents a strained composition). The band gap of the protective layer 27a is less than or equal to that of the barrier layers 23 and 29a, and the band gap of the protective layer 27a is greater than or equal to that of the well layer 25a.

For the growth of the active layer 21, well layers 25b and 25c, protective layers 27b and 27c, and barrier layers 29b and 29c are repeatedly grown between time t8 and time t9, and between time t9 and time t10. Each of the well layers 25b and 25c may include a plurality of InGaN thin layers like the well layer 25a. The indium preflow may be performed before the growth of these InGaN thin layers, and the indium intermediate flows may be performed between the growth of the InGaN thin layers.

The primary surface of the InGaN well layer 25a may tilt by −10 to +10 degrees from the plane orthogonal to the reference axis that extends in the direction of the c-axis of the InGaN well layer 25a. In such a range of angle, the strength of the piezoelectric field is relatively large, and the density of defects can be a reduced in the well layer 25a. Furthermore, a growth condition that is similar to that on the c-plane can be applied thereto, which can make the growth of InGaN thin layers straightforward.

In the growth of the active layer 21, the primary surface of the InGaN well layer 25a may be semipolar. The primary surface tilts from the reference axis that extends in the direction of the c-axis of the InGaN well layer 25a. The tilt angle of the primary surface of the InGaN well layer may be in the range of 10 to 80 degrees. Such a range of angle provides a reduction in the strength of the piezoelectric field in the well layer 25a, an improvement in the non-uniformity of the indium content across the thickness of the well layer 25a, and a reduction in the density of defects in the well layer 25a.

The primary surface of the InGaN well layer 25a may be substantially tilted by an angle of −10 to +10 degrees with reference to the plane orthogonal to the reference axis that extends in the direction of the a-axis or the m-axis of the InGaN well layer 25a. Such a range of angle allows the application of growth conditions similar to that on the a-plane and the m-plane. The use of non-polar planes can substantially eliminate the effect of the piezoelectric field in the well layer, can improve the non-uniformity of the indium content across the thickness of the well layer 25a, and can reduce the density of defects in the well layer 25a.

The thicknesses of the barrier layers 23, 29a, 29b, and 29c each may be in the range of 3.0 to 30 nm. The thicknesses of the protective layers 27a, 27b, and 27c each may be in the range of 0.3 to 3.0 nm. The thicknesses of the well layers 25a, 25b, and 25c each may be in the range of 1.0 to 10 nm. The indium compositions X of the $In_XGa_{1-X}N$ well layers 25a, 25b, and 25c each may be 0.01 or more, or 0.50 or less. The growth of the InGaN well layer having such a range of indium content can provide a light-emitting device that emits light in the range of 370 to 600 nm.

With reference to Part (b) of FIG. 2, in step S105, a second conductive-type gallium nitride-based semiconductor area 31 is epitaxially grown on the active layer 21. This growth is performed in the reactor 10. The second conductive-type gallium nitride-based semiconductor region 31 may include, for example, an electron-blocking layer 33 and a p-type contact layer 35. The electron-blocking layer 33 may be composed of, for example, AlGaN. The p-type contact layer 35 may be composed of, for example, p-type GaN. In this embodiment, the growth temperatures of the electron-blocking layer 33 and the p-type contact layer 35 are, for example, 1100° C. After the formation of the second conductive-type gallium nitride-based semiconductor area 31, an epitaxial wafer E shown in Part (b) of FIG. 2 is completed. The formation of a pair of optical guiding layers for a semiconductor laser may be provided if needed. These optical guiding layers sandwich the active layer 21. The optical guiding layers may be composed of, for example, InGaN or GaN.

EXAMPLE 1

Preflow Cycle and Intermediate Flow (Twice)

Figure 5:
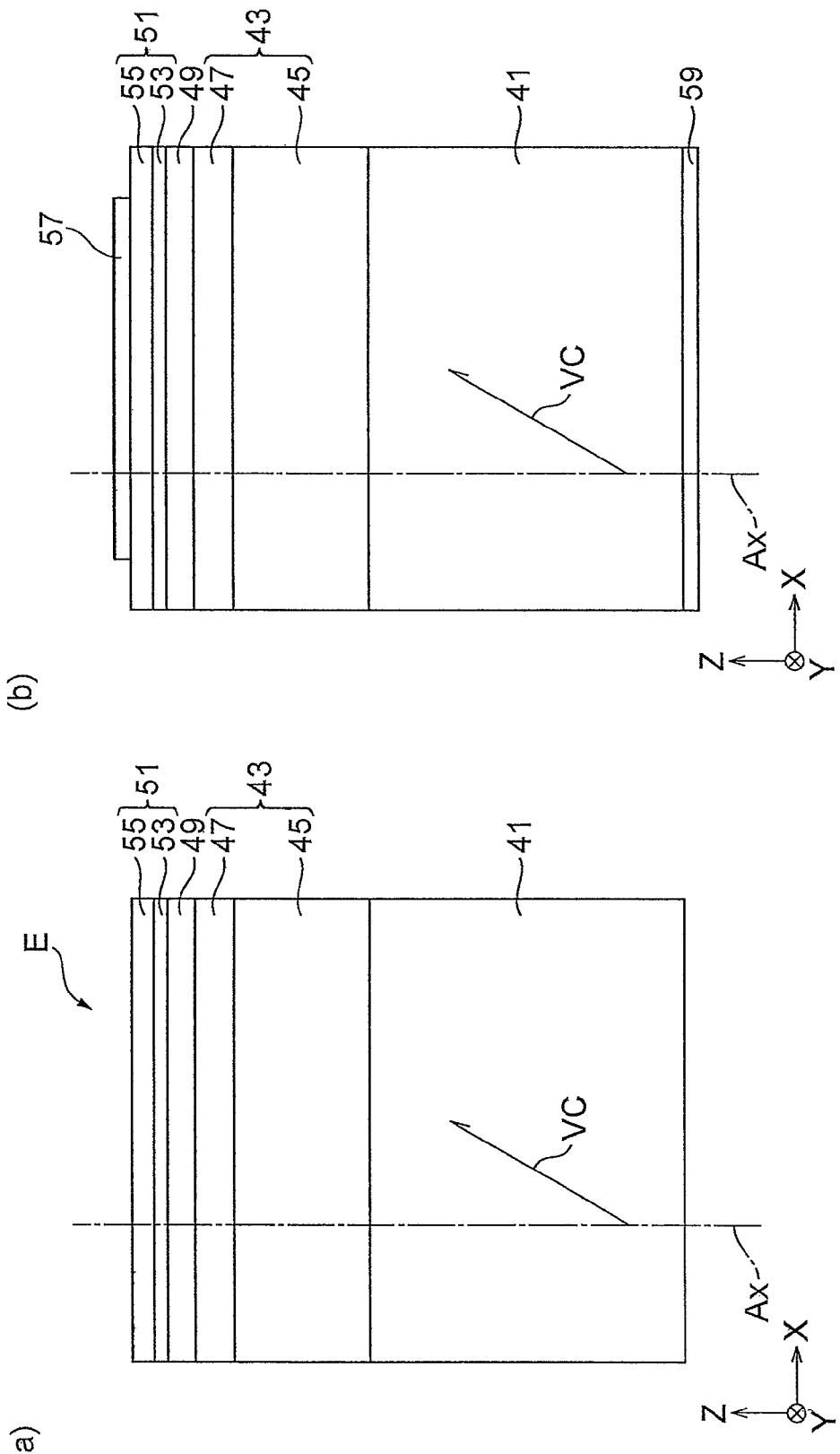
FIG. 5 is a schematic view illustrating a structure of a light-emitting diode according to an embodiment of the present invention.

Parts (a) and (b) of FIG. 5 are schematic views illustrating a structure of a light-emitting diode according to an embodiment of the present invention. The light-emitting diode was fabricated by metal-organic chemical vapor deposition. $NH_3$, TMG, TMI, TMA, $SiH_4$, and $Cp_2Mg$ were used as source gases for metal-organic chemical vapor deposition. A GaN wafer 41 was prepared, and the GaN wafer 41 has an off angle of 18 degrees. $NH_3$ and $H_2$ were supplied to the reactor to heat-treat the GaN wafer 4 at a temperature of 1050° C. An n-type gallium nitride-based semiconductor region 43 was formed on the GaN wafer 41. First, an n-type GaN buffer layer 45 was grown on the GaN wafer 41 at a temperature of 1150° C. Next, an n-type $In_{0.04}Ga_{0.96}N$ buffer layer 47 was grown on the n-type GaN buffer layer 45 at a temperature of 780° C. An active layer 49 was grown on the n-type $In_{0.04}Ga_{0.96}N$ buffer layer 47. In the growth of the active layer 49, a growth temperature of a barrier layer was 870° C., and a growth temperature of a well layer was 690° C. A p-type gallium nitride-based semiconductor area 51 was formed on the active layer 49. First, a p-type AlGaN electron-blocking layer 53 was grown on the active layer 49 at a temperature of 1100° C. Next, a p-type GaN contact layer 55 was grown on the p-type AlGaN electron-blocking layer 53 at a temperature of 1100° C. An epitaxial wafer E was completed through these steps. In the epitaxial wafer E, the semiconductor layers were stacked in the direction of the Ax-axis that is different from that of the c-axis.

In the growth of the active layer 49, InGaN well layers (for example, thickness: 3.0 nm) and GaN barrier layers (for example, thickness: 15 nm) were alternately grown. The growth of the InGaN well layer was carried out through a preflow cycle of indium (for example, 10 seconds), growth of an InGaN thin layer (for example, thickness: 1.5 nm), an intermediate flow cycle of indium (for example, 10 seconds), and then growth of an InGaN thin layer (for example, thickness: 1.5 nm).

Then, electrodes were formed on the epitaxial wafer E as described below. First, a mesa was formed by etching of the epitaxial wafer E. The depth of the mesa was, for example, 500 nm. A transparent electrode 57 (for example, Ni/Au) was formed on the p-type. GaN contact layer 55, a pad electrode (for example, Au) was farmed on the transparent electrode 57, and then an electrode 59 (for example, Ti/Al) was formed on a secondary surface of the GaN wafer 41. After the formation of the electrodes, they were annealed for about one minute at a temperature of 550° C.

Figure 6:
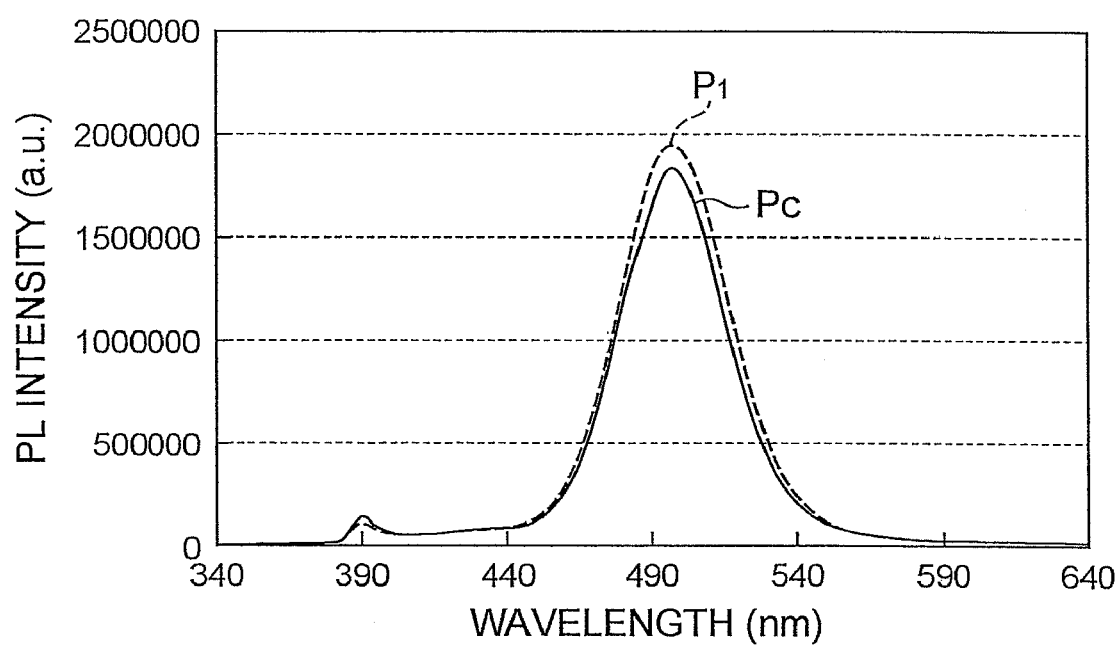
FIG. 6 is a graph showing photoluminescence (PL) spectra of Example 1.

FIG. 6 is a graph showing photoluminescence (PL) spectra of Example 1. A PL spectrum $P_1$ was measured for a light-emitting diode fabricated by a TMI preflow (10 seconds), growth of two InGaN thin layers, a TMI intermediate flow (10 seconds) between the growth of these InGaN thin layers, and growth of a GaN protective layer. A PL spectrum $P_C$ was measured for a light-emitting diode fabricated only by a TMI preflow (10 seconds) and growth of a single well layer (without a TMI intermediate flow). The PL spectrum $P_1$ is improved relative to the PL spectrum $P_C$. The peak wavelength of the PL spectrum $P_1$ is substantially the same as that of the PL spectrum $P_C$. This indicates that indium atoms are not incorporated thereinto by these two kinds of TMI flows. Accordingly, this indicates that the TMI flow can rearrange the surface of the InGaN well layer to reduce the density of defects.

Figure 7:
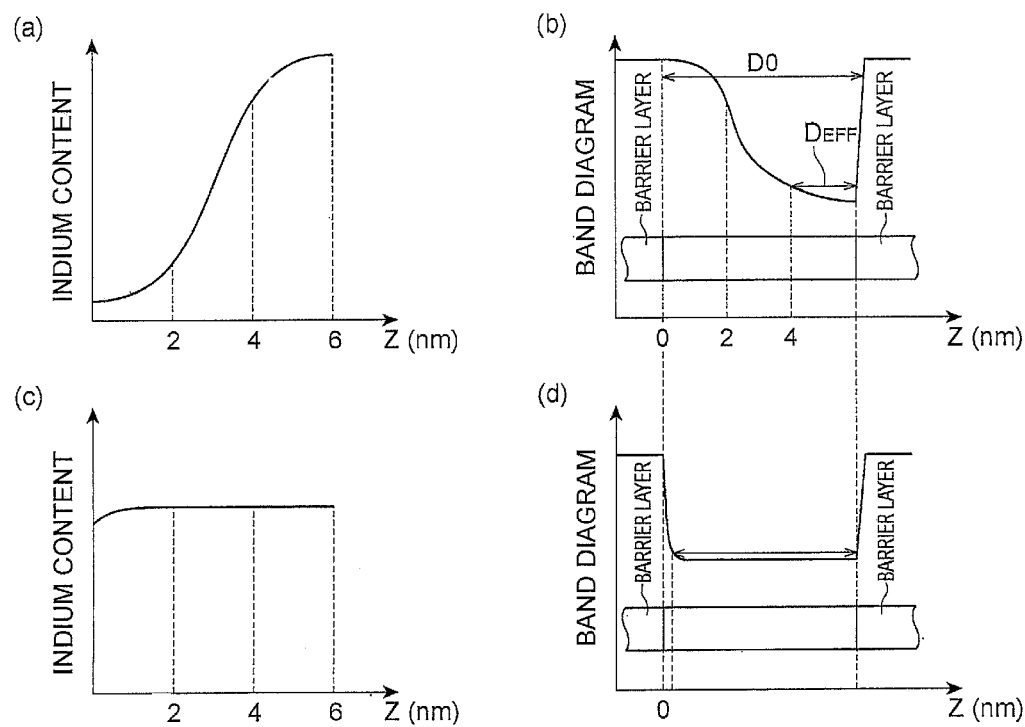
FIG. 7 is a schematic view illustrating structures of well layers with or without a preflow.

Parts (a) to (d) of FIG. 7 are schematic views illustrating structures of well layers with or without preflow. In Parts (a) and (b) of FIG. 7, the horizontal axis of the graphs indicates the coordinate (the Z coordinate) in the thickness direction, whereas the vertical axis of the graphs indicates the indium content. With reference to Part (a) of FIG. 7, in the case where a TMI preflow is not performed, the indium content is low at the initial stage of the growth of the InGaN well layer. As growth of InGaN proceeds from the start of supply of the indium source, strain of InGaN is reduced. This reduction in strain increases the incorporation of indium atoms in its well layer. Thus, the indium profile is distorted with reference to a rectangular shape. Specifically, in the growth period in which an InGaN layer having a thickness of 6 nm is grown, the indium content of the InGaN layer is low in an initial growth stage of the growth after supply of indium, for example, growth of up to 2 nm from a base surface of an underlying layer. After the initial stage of the growth, the indium content of growing InGaN increases towards a target value in a middle stage of the growth of the InGaN layer. In a later stage of the growth of the InGaN layer, the InGaN of a desired indium content is grown. Part (b) of FIG. 7 shows that, in the band structure of the InGaN layer, the effective thickness $D_{EFF}$ of the well layer is smaller than the thickness $D_0$ determined by the period of the supply of indium. In addition, a slope in a band gap around the heterointerface formed at the initial stage of the growth of the well layer is made gradual, thereby decreasing the carrier confinement effect. The volume of the well layer that contributes to light emission decreases, resulting in a reduction in intensity of optical emission. Where a TMI preflow period is provided, an indium source and a nitrogen source are supplied to the reactor prior to supply of a gallium source. In this TMI preflow period, an In crystal and an InN crystal are grown on an underlying layer (for example, a barrier layer). When the supply of a gallium source has started in order to grow a well layer, the In crystal and the InN crystal formed at an initial stage are incorporated into the InGaN layer to prevent a reduction in the indium content of InGaN grown at an initial stage of the growth after supply of the indium source. Therefore, a relatively large slope in the indium content in thickness direction of the InGaN well layer can be reduced. A well layer of a thickness, for example, about 3 nm can be provided with the desired indium content.

With reference to Part (c) of FIG. 7, incorporation of a TMI preflow improves the variation of the indium content across the thickness of the InGaN layer as compared to InGaN growth without a TMI preflow. Part (d) of FIG. 7 shows that the indium content abruptly varies at a heterointerface between the underlying layer and the InGaN layer. This method can enhance incorporation of indium by exposing the surface of the underlying layer (for example, a barrier layer) to an indium atmosphere at the initial stage of the growth of the InGaN well layer. Indium atmosphere formed in the reactor can provide the surface of the underlying layer with a state in which indium atoms has been supplied onto the underlying layer before the growth of the InGaN layer. With reference to Parts (c) and (d) of FIG. 7, a well layer having a homogeneous indium content in the thickness direction can be formed, and the width of the peak of an emission spectrum can be reduced, which can narrow full width at half maximum in the emission spectrum. A steep variation in the band gap around the heterointerface can enhance a carrier confinement performance. In addition, an increase in the volume of the well layer that contributes to light emission can enhances the intensity of the emission. A slight variation in the band gap in the well layer lowers the quantum level of the well layer, resulting in longer emission wavelengths. In crystal orientations in which a piezoelectric field is generated, the piezoelectric field is made uniform over the well layer, so that the emission wavelength shifts to a longer wavelength region by applying a small amount of current having a low screening of piezoelectric effect.

The contribution of the TMI intermediate flow differs from that of the preflow. The TMI intermediate flow acts on the surface of InGaN for the InGaN well layer. The TMI intermediate flow can reduce the density of defects in the growth of each InGaN layer for the well layer. The intermediate flow also functions not only a postflow after the growth of InGaN but also a preflow before the growth of the subsequent InGaN. A thermal treatment of the surface of the InGaN well layer performed in an atmosphere containing the indium source facilitates rearrangement of the surface, which can reduce the density of defects in the InGaN layer that has been grown, and makes the subsequent well layer high quality.

Figure 8:
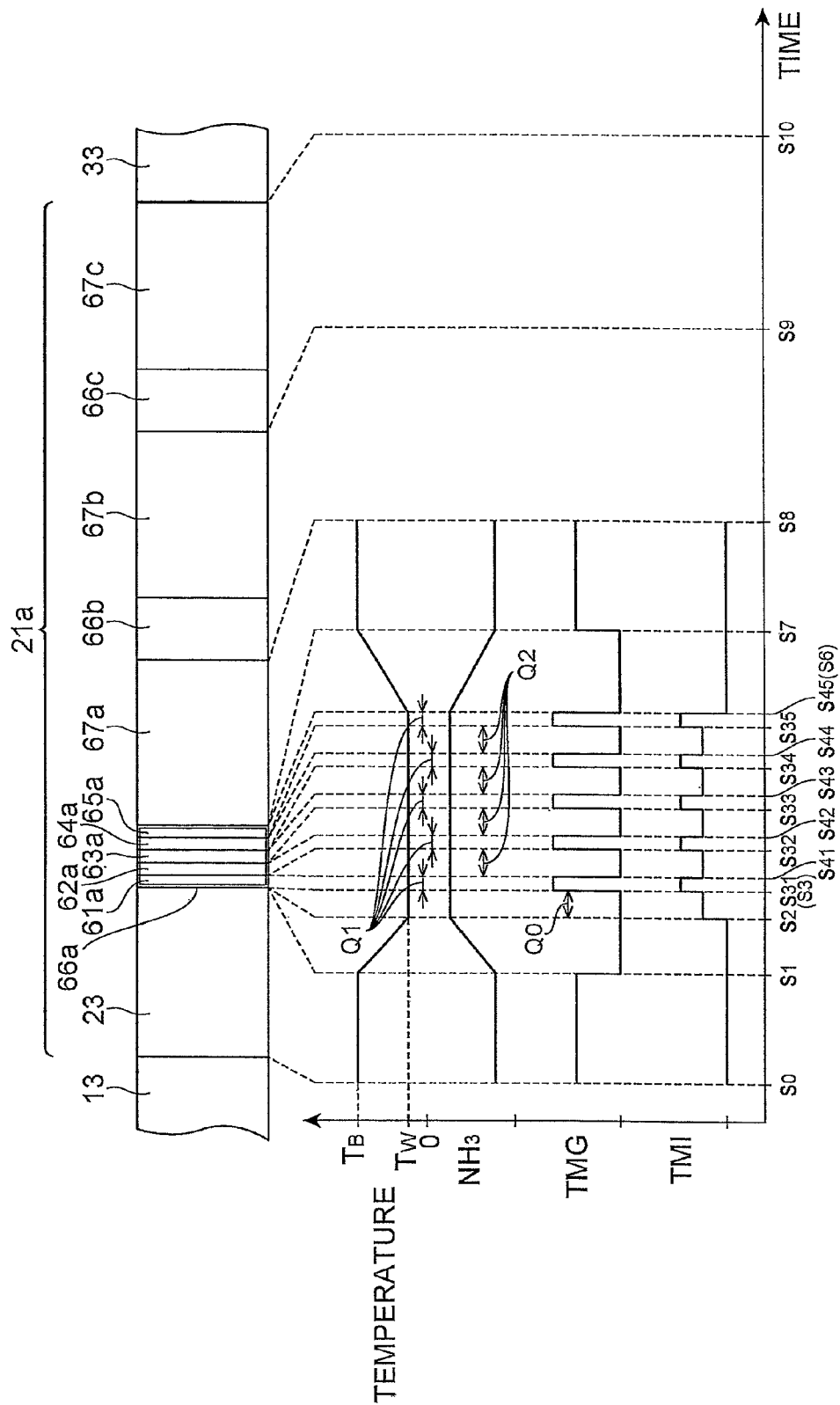
FIG. 8 is another time chart illustrating profile of supply of the source gases and a profile of temperature of the reactor in the formation of an active layer.

Next, another embodiment will be described below. FIG. 8 is another time chart illustrating supply periods of the source gases and the profile of the temperature of the reactor in the formation of an active layer. An active layer 21a is provided on the primary surface 13a of the gallium nitride-based semiconductor region 13.

At a time s0, the substrate is held at a temperature $T_B$. Between time s0 and time s1, the gallium source and the nitrogen source are supplied to the reactor 10 to grow the barrier layer 23 composed of a first gallium nitride-based semiconductor. Between time s1 and time s2, the temperature of the substrate is changed from $T_B$ to $T_W$.

Between time s2 and time s3 (hereinafter referred to as "S31") after the growth of the barrier layer 23, the nitrogen source is supplied to the reactor 10 without supply of the gallium source in order to perform a preflow of the indium source. In the preflow period, no growth is carried out. The preflow period Q0 can be defined as, but not limited to, the preflow period P0.

As described above, at least part of the preflow may be performed at the temperature $T_W$. This part of the preflow step can provide an indium-rich underlying layer formed at the temperature $T_W$, prior to the growth of a well layer 66a. Immediately after the preflow, the well layer 66a composed of InGaN is grown on the barrier layer 23 at the temperature $T_W$ while the gallium source and the nitrogen source are supplied to the reactor 10 without interruption of the supply of the indium source and the nitrogen source. The well layer 66a may be grown at the temperature $T_W$ within the same temperature range as that used for the growth of the well layer 25a.

The period for the growth of the well layers includes first periods Q1 and second periods Q2. Each second period Q2 is between the two adjacent first periods Q1. In each first period Q1, the gallium source and the indium source as Group III raw materials are supplied to the reactor 10 to grow an InGaN thin layer. In each second period Q2, the indium source is supplied to the reactor 10 without supply of the gallium source. The second periods Q2 and the first periods Q1 are each followed by the other. In this embodiment, the first periods Q1 reside between time s31 and time s41, between time s32 and time s42, between time s33 and time s43, between time s34 and time s44, and between time s35 and time s45. Between time s31 and time s41, between time s32 and time s42, between time s33 and time s43, between time s34 and time s44, and between time s35 and time s45, InGaN thin layers 61a, 62a, 63a, 64a, and 65a are grown, respectively. The second periods Q2 reside between time s41 and time s32, time s42 and time s33, time s43 and time s34, time s44 and time s35. The well layer 66a in the active layer 21a includes the InGaN thin layers 61a to 65a (this embodiment has five thin layers). The intermediate flow periods Q2 may be, for example, 10 seconds or more, which completely spreads the indium source over the entire surface of the wafer and forms an indium-rich surface. Alternatively, the intermediate flow periods Q2 may be, for example, 180 seconds or less. This time is enough to make an indium-rich surface on the wafer, and can reduce the amount of the source gas. The thicknesses of the InGaN thin layers are, for example, in the range of 0.3 to 2.0 nm.

The indium preflow period Q0, which is provided before the growth of the InGaN well layer 66a, improves the non-uniformity of the indium content across the thickness of the well layer immediately after the start of the growth of the well layer 66a. Since five InGaN thin layers are grown and four indium intermediate flows are performed during the growth of the well layer in order to form the InGaN well layer, the density of defects in the well layer 66a can be reduced by growing each of the InGaN thin layers 61a to 65a.

At a time s45 (hereinafter referred to as s6), the growth of the well layer 66a is completed. Between time s6 and time s7, the temperature of the substrate is changed from $T_W$ to $T_B$. The present embodiment is not limited to this example, and a protective layer may be grown after the growth of the well layer 66a, in a similar manner to the time chart shown in FIG. 4. The protective layer may be composed of a gallium nitride-based semiconductor, for example, $In_ZGa_{1-Z}N$ (indium content Z: $0 \leq Z < 1$, Z represents a strained composition).

After the temperature of the substrate has been changed, a barrier layer 67a is grown on the well layer 66a at the temperature $T_B$ between time s7 and time s8. The barrier layer 67a may be composed of a second gallium nitride-based semiconductor.

For the growth of the active layer 21a, well layers 66b and 66c, and barrier layers 67b and 67c are repeatedly grown between time s8 and time s9, and between time s9 and s10. Each of the well layers 66b and 66c may also include a plurality of InGaN thin layers. The indium preflow may be performed before the growth of these InGaN thin layers, and the indium intermediate flows may be performed between the growth of the InGaN thin layers.

The primary surface of the InGaN well layer 66a may be polar, semipolar, or nonpolar, like the well layer 25a. These methods can improve the non-uniformity of the indium content across the thickness of the well layer 66a, and reduce the density of defects in the well layer 66a on the primary surface.

The thickness and the composition of the barrier layers 67a, 67b, and 67c may be the same as those of the barrier layers 23, 29a, 29b, and 29c, and the thickness and the composition of the well layers 66a, 66b, and 66c may be the same as those of the well layers 25a, 25b, and 25c, but the above limitations are not essential in the present embodiments.

EXAMPLE 2

Preflow Cycle and Intermediate Flow (Four Times)

A light-emitting diode having a structure shown in Part (a) and (b) of FIG. 5 was fabricated by metal-organic chemical vapor deposition. The light-emitting diode of Example 2 was fabricated as in Example 1 except for the formation of the active layer 49. In the formation of the active layer 49, the growth temperature of the barrier layer was 870° C., and the growth temperature of the well layer was 690° C. The well layer was fabricated through one indium preflow and four indium intermediate flows, and was composed of five InGaN thin layers.

Figure 9:
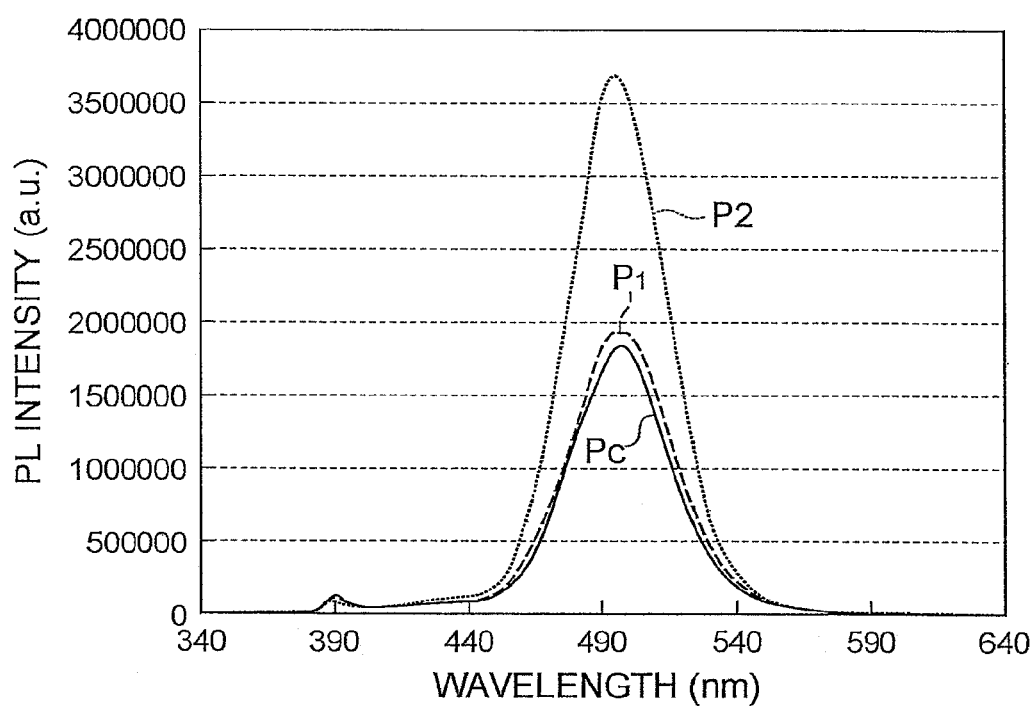
FIG. 9 is a graph showing photoluminescence (PL) spectra of Example 2.

FIG. 9 is a graph showing PL spectra of Example 2. A PL spectrum $P_2$ was measured for a light-emitting diode fabricated by a TMI preflow (10 seconds), growth of five InGaN thin layers, and four TMI intermediate flows (10 seconds) performed during the growth of these InGaN thin layers. PL spectra $P_C$ and $P_1$ are also shown in FIG. 9 for reference. The PL spectrum $P_2$ is improved relative to the PL spectrum $P_1$ because the peak intensity of the PL spectrum $P_2$ is about 1.8 times as that of the PL spectrum $P_1$. The peak wavelength of the PL spectrum $P_2$ is substantially the same as that of the PL spectrum $P_C$, and the peak wavelength of the PL spectrum $P_2$ is substantially the same as that of the PL spectrum $P_1$. This indicates that indium atom by the TMI flows s are not incorporated even into the well layer fabricated by the increased times of the indium intermediate flows and the decreased thickness of each InGaN thin layer. Accordingly, this indicates that rearrangement of the surface of the InGaN well layer through the TMI flows can reduce the creation of defects therein.

Figure 10:
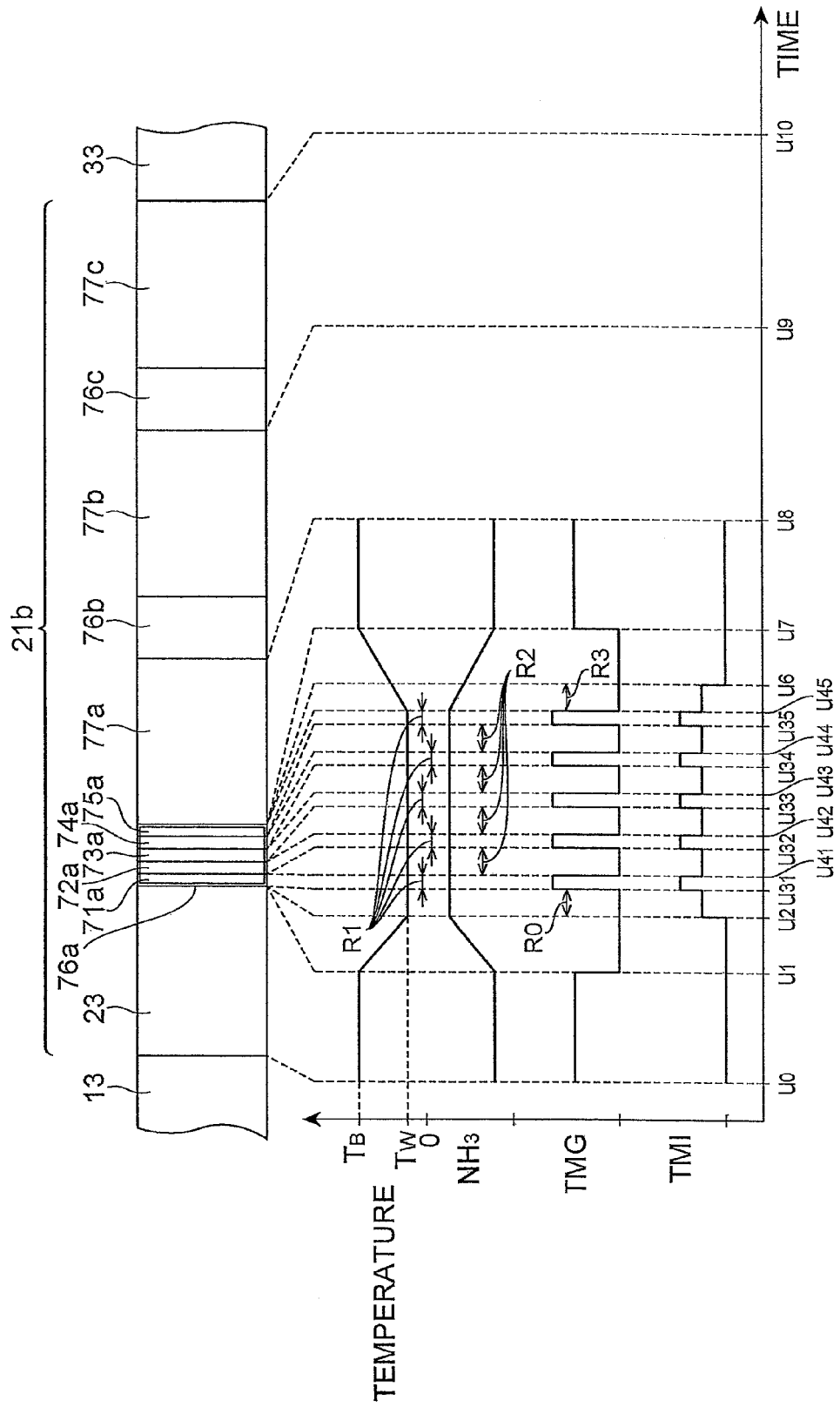
FIG. 10 is another time chart illustrating a profile of supply of the source gases and a profile of temperature of the reactor in formation of an active layer.

Next, another embodiment will be described below. FIG. 10 is another time chart illustrating supply periods of the source gases and a profile of the temperature of the reactor during formation of an active layer. An active layer 21b is provided on the primary surface 13a of a gallium nitride-based semiconductor area 13.

At a time u0, the substrate is kept at a temperature $T_B$. Between time u0 and time u1, the gallium source and the nitrogen source are supplied to the reactor 10 to grow the barrier layer 23 composed of a first gallium nitride-based semiconductor. Between time u1 and time u2, the temperature of the substrate is changed from $T_B$ to $T_W$. After the growth of the barrier layer 23, between time u2 and time u3, the nitrogen source is supplied to the reactor 10 without supply of the gallium source and a preflow of the indium source is to performed. Accordingly, in the preflow period, no growth is carried out. In the embodiments, the preflow period R0 can be defined as the preflow period Q0, but not limited thereto.

As described above, at least part of the preflow may be performed at the temperature $T_W$. This preflow step can facilitate to form an indium-rich underlying layer at the temperature $T_W$, prior to the growth of a well layer 76a. Immediately after the preflow, the well layer 76a composed of InGaN is grown on the barrier layer 23 at the temperature $T_W$ while the gallium source and the nitrogen source are supplied to the reactor 10 without interruption of the supply of the indium source and the nitrogen source. The well layer 76a is grown at the temperature $T_W$ within the same temperature range as that used for the growth of the well layer 25a.

The period for the growth of the well layers includes first periods R1 and second periods R2. Each second period R2 is between the two adjacent first periods R1. In each first period R1, an InGaN thin layer is grown while the gallium source and the indium source as Group III constituents are supplied to the reactor 10. In each second period R2, the indium source is supplied to the reactor 10 without supply of the gallium source. Each first period R1 is followed by each second period R2. In this embodiment, the first periods R1 reside between time u31 and time u41, between time u32 and time u42, between time u33 and time u43, between time u34 and time u44, and between time u35 and time u45. Between time u31 and time u41, between time u32 and time u42, between time u33 and time u43, between time u34 and time u44, and between time u35 and time u45, InGaN thin layers 71a, 72a, 73a, 74a, and 75a are grown, respectively. The second periods R2 reside between time u41 and time u32, between time u42 and time u33, between time u43 and time u34, and between time u44 and time u35. The well layer 76a in the active layer 21b includes the InGaN thin layers 71a to 75a (this embodiment has five thin layers). After the growth of the InGaN thin layer 75a, an indium postflow period R3 is provided between time u45 and time u6. In the indium postflow period R3, the indium source is supplied to the reactor 10 without supply of the gallium source. Process conditions used in the periods R1 and R2 are defined to be the same as those of the periods Q1 and Q2, respectively.

The indium preflow period R0, which is provided before the growth of the InGaN well layer 76a, improves the non-uniformity of the indium content in the direction for the thickness of the well layer, immediately after the growth of the well layer 76a. Since two or more InGaN thin layers are grown and indium intermediate flows are performed between the growths of InGaN thin layers in order to form the InGaN well layer, the density of defects for each growth of the InGaN thin layers 71a to 75a can be reduced in the well layer 76a. In addition, the indium postflow is performed after the growth of the well layer 76a, so that the density of defects can be further reduced.

At a time u6, the postflow period R3 after the growth of the well layer 76a is completed. Between time u6 and time u7, the temperature of the substrate is changed from $T_W$ to $T_B$. The present embodiment is not limited to this example, and a protective layer can be grown after the growth of the well layer 76a, in a similar manner to the time chart shown in FIG. 8. The protective layer may be composed of a gallium nitride-based semiconductor, for example, $In_ZGa_{1-Z}N$ (indium content Z: $0 \leq Z < 1$, Z represents a strained composition). The postflow period R3 may be, for example, 10 seconds or more, and can enables to completely spread the indium source over the entire surface of the wafer and to form an indium-rich surface. Alternatively, the postflow period R3 may be, for example, 30 seconds or less. This time is enough to make an indium-rich surface on the wafer and can reduce the amount of the source gas.

After the change of the temperature of the substrate, a barrier layer 77a is grown on the well layer 76a at the temperature $T_B$ between time u7 and time u8. The barrier layer 77a is composed of a second gallium nitride-based semiconductor.

For the growth of the active layer 21b, well layers 76b and 76c, and barrier layers 77b and 77c are repeatedly grown between time u8 and time u9, and between time u9 and u10. Each of the well layers 76b and 76c may also include a plurality of InGaN thin layers. The indium preflow may be performed before the growth of each InGaN thin layer, and the indium intermediate flows may be performed between the growths of the InGaN thin layers. In addition, the indium postflow may be performed after the growth of the well layer 76a.

The indium postflow, which performs a thermal treatment of the surface of the InGaN well layer in an atmosphere containing the indium source, facilitates rearrangement of its surface. At least part of the postflow may be performed at the temperature $T_W$. The indium postflow at the growth temperature of the well layer can reduce defects in the surface of the as-grown InGaN layer. After the indium postflow, a protective layer may be grown on the well layer. After the surface has been rearranged by the indium postflow, the surface of the InGaN well layer is covered with the protective layer, which prevents indium from desorbing from the surface of the well layer to maintain a good surface condition thereof.

The primary surface of the InGaN well layer 76a may be polar, semipolar, or nonpolar, like the well layer 25a. These methods can improve the profile of the indium content across the thickness of the well layer 76a, and reduce the density of defects in the well layer 76a on the primary surface.

The thickness and the composition of the barrier layers 77a, 77b, and 77c may be the same as those of the barrier layers 23, 29a, 29b, and 29c, and the thickness and the composition of the well layers 76a, 76b, and 76c may be the same as those of the well layers 25a, 25b, and 25c, but such limitations are not essential.

EXAMPLE 3

Preflow, Intermediate Flow (Four Times), and Postflow

A light-emitting diode having a structure shown in Parts (a) and (b) of FIG. 5 was fabricated by metal-organic chemical vapor deposition. The light-emitting diode of Example 3 was fabricated as in Example 1 except for the formation of the active layer 49. In the formation of the active layer 49, the growth temperature of the barrier layer was 870° C., and the growth temperature of the well layer was 690° C. The well layer was fabricated through one indium preflow, four indium intermediate flows, and one indium postflow, and included five InGaN thin layers.

Figure 11:
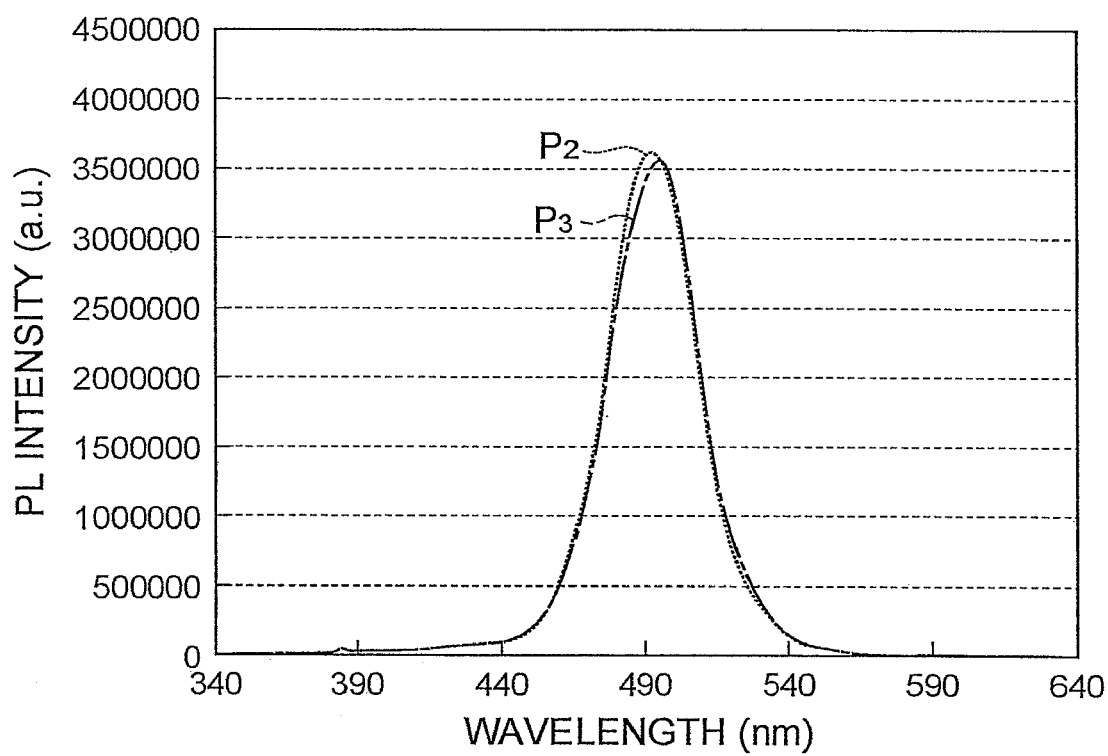
FIG. 11 is a graph showing photoluminescence (PL) spectra of Example 3.

FIG. 11 is a graph showing photoluminescence (PL) spectra of Example 3. A PL spectrum $P_3$ was measured for a light-emitting diode fabricated by a TMI preflow (10 seconds), growth of five InGaN thin layers, four TMI intermediate flow (10 seconds) for the growth of the InGaN thin layers, and a TMI postflow (10 seconds). A PL spectrum $P_2$ is also shown in FIG. 11 for reference. The peak intensity of the PL spectrum $P_3$ is substantially the same as that of the PL spectrum $P_2$, whereas the peak wavelength of the PL spectrum $P_3$ is approximately equal to that of the PL spectrum $P_2$. This indicates that atoms of indium are not incorporated in the TMI flows even in the well layer fabricated by a number of times of the indium intermediate flows and InGaN thin layers with a small thickness. This indicates that the TMI flows facilitate rearrangement of the surface of the InGaN well layer, resulting in a reduction in defects. The postflow also induces the rearrangement of the surface of the InGaN well layer. Although the PL characteristics shown in FIG. 11 are not so different from each other, the PL intensity is different from the above when the intensity of the excitation light is lowered, and the PL intensity of the light-emitting diode to which the postflow was performed was higher. This indicates the density of defects is reduced.

Part (a) of FIG. 12 is a graph illustrating the external quantum efficiency (EQE) of the light-emitting diode. Characteristic lines F0, F1, F2, and F5 are shown in the graph. The number (N1) of the indium intermediate flows is the suffix of "F" minus 1.

At characteristic line F0, the well thickness is 3.0 nm, the period of the indium intermediate flow is 0 second, and the period of the indium preflow is 0 second;

At characteristic line F1, the well thickness is 3.0 nm, the period of the indium intermediate flow is 10 seconds, and the period of the indium preflow is 10 seconds;

At characteristic line F2, the well thickness is 3.0 nm, the period of the indium intermediate flow is 10 seconds, and the period of the indium preflow is 10 seconds; and At characteristic line F5, the well thickness is 3.0 nm, the period of the indium intermediate flow is 10 seconds, and the period of the indium preflow is 10 seconds.

The external quantum efficiency is improved as the number of indium intermediate flows increase. In particular, the improvement is remarkable at smaller injection currents, which indicates that the density of defects is controlled. As the injection current increases, many defect levels are occupied. This occupation cancels the difference in emission characteristics caused by a difference in the density of defects.

Part (b) of FIG. 12 is a graph illustrating the temperature dependence of the PL integrated intensity of the light-emitting diode. Characteristic lines IPL0 and IPL5 are shown in the graph. The number (N2) of the indium intermediate flows is the suffix of "IPL" minus 1.

At characteristic line IPL0, the well thickness is 3.0 nm, the period of the indium intermediate flow is 0 second, and the period of the indium preflow is 0 second; and At characteristics line IPL5, the well thickness is 3.0 nm, the period of the indium intermediate flow is 10 seconds, and the period of the indium preflow is 10 seconds.

In the temperature dependence of the PL integrated intensity of the light-emitting diode, as the number of indium intermediate flows increases, the thermal quenching is delayed. Hence, as the number of indium intermediate flow cycles increases, the number of nonradiative recombination centers decreases. The indium intermediate flows reduce the number of crystal defects in the well layer composed of the InGaN thin layers.

Figure 13:
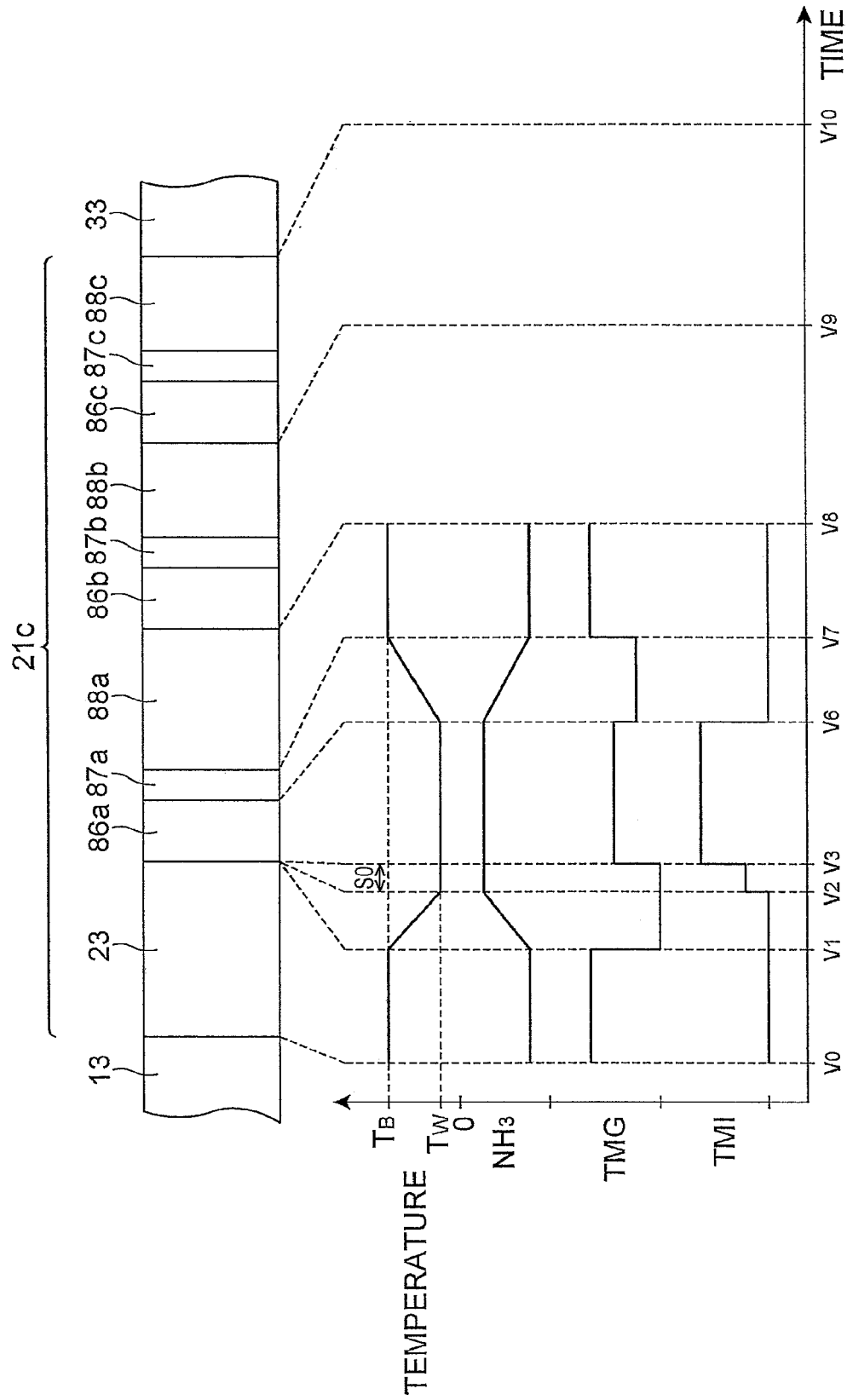
FIG. 13 is another time chart illustrating a profile of supply of the source gases and a profile of temperature of the reactor in formation of an active layer.

Next, another embodiment is described. FIG. 13 is another time chart illustrating supply periods of the source gases and change of the temperature of the reactor for the formation of an active layer. An active layer 21c is provided on the primary surface 13a of the gallium nitride-based semiconductor area 13.

At a time v0, the substrate is held at the temperature $T_B$. Between time v0 and time v1, the barrier layer 23 composed of a first gallium nitride-based semiconductor is grown while the gallium source and the nitrogen source are supplied to the reactor 10. Between time v1 and time v2, the temperature of the substrate is changed from $T_B$ to $T_W$.

After the growth of the barrier layer 23, between time v2 and time v3, a preflow of the indium source is performed while the nitrogen source is supplied to the reactor 10 without supply of the gallium source. In the preflow period, no growth occurs. The preflow period S0 can be defined as the preflow period P0, but is not limited thereto.

As described above, at least part of the preflow may be performed at the temperature $T_W$. This preflow step can form an indium-rich underlying layer at the temperature $T_W$, prior to the growth of a well layer 86a. Immediately after the preflow period S0, the well layer 86a composed of InGaN is grown on the barrier layer 23 at the temperature $T_W$ while the gallium source and the nitrogen source are supplied to the reactor 10 without interruption of the supply of the indium source and the nitrogen source. The well layer 86a is grown at the temperature $T_W$ within the same temperature range as that used for the growth of the well layer 25a.

In the period of the growth of the well layer, a single InGaN layer is grown while the gallium source and the indium source as Group III raw material are supplied to the reactor 10 without an indium intermediate flow. The well layer 86a is grown between time v3 and time v6. The well layer 86a in the active layer 21c is composed of a single InGaN layer which is continuously grown, not a plurality of InGaN thin layers. An indium postflow may be performed after the growth of the InGaN layer 86a, if needed. In the period, the indium source is supplied to the reactor 10 without supply of the gallium source.

The indium preflow period S0, which is provided before the growth of the InGaN well layer 86a, improves the non-uniformity of the indium content across the thickness of the well layer, immediately after the growth of the well layer 86a. The indium postflow may be performed after the growth of the well layer 86a. The postflow step can reduce the density of defects on the surface of the InGaN well layer by the rearrangement performed before the subsequent growth, thereby enhancing the crystal quality of a protective layer and the crystal quality of the barrier layer. At least part of the indium postflow may be performed at the temperature of $T_W$. The indium postflow period at the growth temperature for the well layer can reduce defects on the surface of the grown InGaN well layer. A protective layer may be grown on the well layer after the indium postflow. The surface of the InGaN well layer is covered with the protective layer after the rearrangement of the surface caused by the indium postflow, so that the desorption of indium from the surface of the well layer is reduced, resulting in maintaining a good surface condition.

At a time v6, the growth of the well layer 86a is completed. In this embodiment, a protective layer 87a is grown while the temperature of the substrate is raised from $T_W$ to $T_B$. The protective layer 87a may be composed of a gallium nitride-based semiconductor, for example, $In_ZGa_{1-Z}N$ (indium content Z: $0 \leq Z < 1$, Z represents a strained composition). The protective layer 87a is grown during all or part of the period of the switched temperature.

After the change of the temperature of the substrate is completed, a barrier layer 88a is grown on the protective layer 87a at the temperature $T_B$ between time v7 and time v8. The barrier layer 88a is composed of a second gallium nitride-based semiconductor.

For the growth of the active layer 21c, well layers 86b and 86c, protective layers 87b and 87c, and barrier layers 88b and 88c are repeatedly grown between time v8 and time v9, and between time v9 and time v10. Each of the well layers 86b and 86c may also include a single InGaN layer. The indium preflow may be performed before the growth of the InGaN layer, and the indium postflow may be performed after the growth of the well layer 86a.

The thickness and the composition of the barrier layers 88a, 88b, and 88c may be the same as those of the barrier layers 23, 29a, 29b, and 29c, and the thickness and the composition of the well layers 86a, 86b, and 86c may be the same as those of the well layers 25a, 25b, and 25c, but such limitations are not essential.

EXAMPLE 4

Preflow and Growth of Protective Layer

A light-emitting diode having a structure shown in Parts (a) and 5 of FIG. 5 was fabricated by metal-organic chemical vapor deposition. The light-emitting diode of Example 4 was fabricated as in Example 1 except for the formation of the active layer 49. In the formation of the active layer 49, the growth temperature of the barrier layer was 870° C., and the growth temperature of the well layer was 690° C. The well layer was fabricated through one indium preflow cycle, and included a single InGaN well layer and a GaN protective layer.

Parts (a) and (b) of FIG. 14 are graphs showing photoluminescence (PL) spectra of Example 4. Part (a) of FIG. 14 shows a spectrum $P_4$ of a light-emitting diode, together with a PL spectrum $P_C$ for reference, and the light-emitting diode was fabricated by using an indium preflow, growth of a single InGaN well layer (thickness: 4 nm), and growth of a GaN protective layer. The indium preflow step enables the surface of the underlying layer to adsorb indium, and enhances incorporation of indium at an initial stage of the growth of the well layer.

In particular, the TMI preflow improves the incorporation of indium, and the peak wavelength of the PL spectrum shifts to a longer wavelength side. The uniformity of the indium content across the thickness of the well layer becomes excellent, and the indium content in the entire InGaN layer increases. As can be seen from the comparison between the spectra $P_4$ and $P_C$, improvement in the crystal quality of the InGaN layer is desirable.

Part (b) of FIG. 14 shows spectra $P_5$ and $P_6$. The spectrum $P_5$ represents a PL spectrum of a light-emitting diode including a well layer having a thickness of 3 nm, not 4 nm, whereas the spectrum $P_6$ represents a PL spectrum of a light-emitting diode including a well layer having a thickness of 3 nm, which is fabricated without a preflow. Part (b) of FIG. 14 shows spectra $P_4$ and $P_C$ for reference. As can be seen from the comparison between the spectra $P_C$ and $P_5$, the change in the thickness of the well layer causes the peak wavelength of the PL spectrum to shift to a shorter wavelength side. In addition, the intensity of the PL spectrum increases to 2 times or more by use of the indium preflow and the reduction in the thickness of the well layer.

Although the principle of the present invention has been illustrated and described by the preferred embodiments, it should be noted that persons skilled in the art can modify the arrangements and the details of the present invention without deviation from the principle. The present invention is not limited to any particular configuration disclosed in the embodiments. It is therefore understood that the appended claims are intended to cover all modifications and changes as fall within the true spirit and scope of the invention.

The invention claimed is:

1. A method of fabricating a nitride-based semiconductor optical device by metal-organic chemical vapor deposition, the nitride-based semiconductor optical device including an active layer, the method comprising the steps of:

growing a barrier layer at a first temperature while supplying a first raw material gas to a reactor, the first raw material gas including a gallium source as Group III raw material, and the barrier layer comprising a first gallium nitride-based semiconductor;

after the growth of the barrier layer, supplying a nitrogen source and an indium source to the reactor without supply of the gallium source to perform a preflow of the indium source; and immediately after the preflow, growing a well layer on the barrier layer at a second temperature while supplying a second raw material gas to the reactor, the second raw material gas including the indium source and the gallium source as Group III raw material, the well layer comprising InGaN, and the second temperature being lower than the first temperature, the gallium source and the indium source being supplied as Group III raw material to the reactor to grow plural InGaN layers during plural first periods of the step of growing the well layer, respectively, the indium source being supplied to the reactor without supply of the gallium source during a second period of the step of growing the well layer, the second period being between the first periods, the well layer comprising the plural InGaN layers, the active layer comprising the well layer and the barrier layer, and the active layer being provided on a primary surface of a gallium nitride-based semiconductor region.

2. The method according to claim 1, wherein at least part of a period of the preflow is performed at the second temperature.

3. The method according to claim 1, wherein the indium source includes trimethylindium, and the nitrogen source includes ammonia.

4. The method according to claim 1, the method further comprising the step of performing a postflow of the indium source to the reactor without supply of the gallium source immediately after growing the well layer.

5. The method according to claim 4, wherein at least part of a period of the postflow is performed at the second temperature.

6. The method according to claim 5, the method further comprising the step of, after the postflow, growing another barrier layer of a second gallium nitride-based semiconductor on the well layer at the first temperature.

7. The method according to claim 1, the method further comprising the steps of:

growing a protective layer of a gallium nitride-based semiconductor on the well layer just after growing the well layer; and growing another barrier layer of a second gallium nitride-based semiconductor on the protective layer at the first temperature, a band gap of the protective layer being less than or equal to that of the barrier layer, and the band gap of the protective layer being greater than that of the well layer.

8. The method according to claim 4, the method further comprising the steps of:

after the postflow, growing a protective layer composed of the gallium nitride-based semiconductor on the well layer; and growing another barrier layer of a second gallium nitride-based semiconductor on the protective layer at the first temperature, a band gap of the protective layer being less than or equal to that of the barrier layer, and the band gap of the protective layer being greater than that of the well layer.

9. The method according to claim 7, wherein a temperature of the substrate is increased in at least part of a growth period of the protective layer.

10. The method according to claim 1, wherein a primary surface of the InGaN well layer is semipolar and is tilted from a reference axis extending in a direction of c-axis of InGaN of the well layer, and a tilt angle of the primary surface of the well layer is in the range of 10 to 80 degrees.

11. The method according to claim 1, wherein a primary surface of the InGaN well layer tilts by −10 to +10 degrees from a plane orthogonal to a reference axis extending in a direction of c-axis of the InGaN well layer.

12. The method according to claim 1, wherein a primary surface of the InGaN well layer tilts by −10 to +10 degrees from a plane orthogonal to a reference axis extending in a direction of one of a-axis and m-axis of the InGaN well layer.

13. The method according to claim 1, the method further comprising the steps of:

preparing a substrate of one of gallium nitride-based semiconductor and Group III nitride semiconductor; and growing the gallium nitride-based semiconductor region on a primary surface of the substrate.

14. The method according to claim 13, wherein the substrate comprises GaN.

15. The method according to claim 13, wherein the substrate comprises AlGaN.

16. The method according to claim 13, wherein the substrate comprises AlN.

17. The method according to claim 13, wherein the primary surface of the substrate is semipolar and tilts from the reference axis extending in a direction of the c-axis of the gallium nitride-based semiconductor, and a tilt angle of the primary surface of the substrate is in the range of 10 to 80 degrees.

18. The method according to claim 13, wherein the substrate comprises GaN, and the substrate of GaN has a threading dislocation density of $1 \times 10^{+7}$ cm$^{-2}$ or less.

19. The method according to claim 1, the method further comprising the steps of:

preparing a substrate of sapphire; and growing the gallium nitride-based semiconductor region on a primary surface of the substrate.

* * * * *